(12) United States Patent
Ohido

(10) Patent No.: US 7,811,465 B2
(45) Date of Patent: *Oct. 12, 2010

(54) MAGNETIC GARNET SINGLE CRYSTAL AND OPTICAL ELEMENT USING SAME AS WELL AS METHOD OF PRODUCING SINGLE CRYSTAL

(75) Inventor: Atsushi Ohido, Tokyo (JP)

(73) Assignee: TDK Corporation, Tokyo (JP)

( * ) Notice: Subject to any disclaimer, the term of this patent is extended or adjusted under 35 U.S.C. 154(b) by 173 days.

This patent is subject to a terminal disclaimer.

(21) Appl. No.: 11/666,331

(22) PCT Filed: Nov. 17, 2005

(86) PCT No.: PCT/JP2005/021103

§ 371 (c)(1),
(2), (4) Date: May 17, 2007

(87) PCT Pub. No.: WO2006/054628

PCT Pub. Date: May 26, 2006

(65) Prior Publication Data

US 2008/0095686 A1    Apr. 24, 2008

(30) Foreign Application Priority Data

| Nov. 19, 2004 | (JP) | ............................. 2004-335457 |
| Sep. 30, 2005 | (JP) | ............................. 2005-286734 |
| Oct. 18, 2005 | (JP) | ............................. 2005-303286 |
| Oct. 26, 2005 | (JP) | ............................. 2005-311682 |
| Oct. 26, 2005 | (JP) | ............................. 2005-311688 |

(51) Int. Cl.
G02F 1/09 (2006.01)

(52) U.S. Cl. ................. 252/62.57; 117/945; 252/62.58; 252/62.59; 252/62.63

(58) Field of Classification Search ............... 252/62.57, 252/62.58, 62.59, 62.63; 117/945
See application file for complete search history.

(56) References Cited

U.S. PATENT DOCUMENTS

| 4,077,832 A * | 3/1978 | Robertson et al. ........ 428/822.2 |
| 4,402,787 A | 9/1983 | Matsuzawa et al. |
| 4,444,615 A | 4/1984 | Matsuzawa et al. |
| 4,519,870 A | 5/1985 | Matsuzawa et al. |
| 4,698,820 A | 10/1987 | Brandle, Jr. et al. |
| 5,920,420 A | 7/1999 | Ishikura et al. |
| 6,059,878 A | 5/2000 | Takeda et al. |
| 6,527,973 B2 | 3/2003 | Ohido et al. |
| 6,775,052 B2 | 8/2004 | Sugawara et al. |
| 6,853,473 B2 | 2/2005 | Ohido et al. |
| 6,875,270 B2 | 4/2005 | Ohido et al. |
| 7,022,303 B2 | 4/2006 | Riman et al. |
| 7,133,189 B2 | 11/2006 | Ohido et al. |
| 7,187,496 B2 | 3/2007 | Sugawara et al. |
| 7,242,516 B2 | 7/2007 | Sugawara et al. |
| 7,280,264 B2 | 10/2007 | Goto et al. |
| 7,333,261 B2 | 2/2008 | Ohido et al. |
| 7,517,406 B2 | 4/2009 | Ohido et al. |
| 2003/0211369 A1 | 11/2003 | Riman et al. |
| 2003/0219261 A1 * | 11/2003 | Ohido et al. ................ 398/207 |
| 2006/0112873 A1 | 6/2006 | Uchida et al. |
| 2007/0002425 A1 | 1/2007 | Goto et al. |
| 2007/0160875 A1 | 7/2007 | Ohido |
| 2007/0193504 A1 | 8/2007 | Ohido |
| 2008/0095686 A1 | 4/2008 | Ohido |
| 2009/0294682 A1 | 12/2009 | Perna |
| 2009/0294683 A1 | 12/2009 | Perna |

FOREIGN PATENT DOCUMENTS

| DE | 2 318 798 | 10/1973 |
| EP | 0 208 476 A2 | 1/1987 |
| JP | B 57-45719 * | 9/1982 |
| JP | A-62-143893 | 6/1987 |
| JP | B2-06-46604 | 6/1994 |
| JP | A-09-202697 | 8/1997 |
| JP | A-10-072296 | 3/1998 |

(Continued)

OTHER PUBLICATIONS

Park et al, "Growth of epitaxial garent film by LPE for application to integrated magneto-optic light switch arrays", Phys. stat. sol. (a) 201,#8,pp. 1976-1979, May 14, 2004.*

(Continued)

Primary Examiner—C. Melissa Koslow
(74) Attorney, Agent, or Firm—Oliff & Berridge, PLC

(57) ABSTRACT

The present invention relates to a magnetic garnet single crystal prepared by the liquid phase epitaxial (LPE) process and an optical element using the same as well as a method of producing the single crystal, for the purpose of providing a magnetic garnet single crystal at a reduced Pb content and an optical element using the same, as well as a method of producing the single crystal.

The magnetic garnet single crystal is grown by the liquid phase epitaxial process and is represented by the chemical formula $Bi_xNa_yPb_zM1_{3-x-y-z}Fe_{5-w}M2_wO_{12}$ (M1 is at least one element selected from Y, Sm, Eu, Gd, Tb, Dy, Ho, Er, Tm, Yb and Lu; and M2 is at least one element selected from Ga, Al, In, Ti, Ge, Si and Pt, provided that $0.5 < x \leq 2.0$, $0 < y \leq 0.8$, $0 \leq z < 0.01$, $0.19 \leq 3-x-y-z < 2.5$, and $0 \leq w \leq 1.6$).

2 Claims, 6 Drawing Sheets

FOREIGN PATENT DOCUMENTS

| | | | |
|---|---|---|---|
| JP | A 2000-86396 | * | 3/2000 |
| JP | A 2001-44026 | * | 2/2001 |
| JP | A 2001-44027 | * | 2/2001 |
| JP | A-2003-306397 | | 10/2003 |
| JP | 2004-269305 | * | 3/2004 |
| JP | A 2004-83390 | * | 3/2004 |
| JP | A 2004-26305 | * | 9/2004 |
| JP | A-2006-169093 | | 6/2006 |
| WO | WO 2005/056887 A1 | | 6/2005 |
| WO | WO 2006/054628 A1 | | 5/2006 |

OTHER PUBLICATIONS

Robertson, J.M.; "Improvement of Lead-Free Flux Systems for the Growth of Bismuth-Substituted Iron Garnet Films by Liquid Phase Epitaxy;" *Journal of the Electrochemical Society*; vol. 123, No. 8; Aug. 1976; pp. 1248-1249.

Feb. 24, 2010 Office Action issued in U.S. Appl. No. 11/704,192.

May 17, 2010 Extended European Search Report issued in EP 07 00 1472.

Jun. 11, 2010 Final Office Action issued in U.S. Appl. No. 11/655,070.

* cited by examiner

| Element | Valence | Ion radius (Å) |
|---|---|---|
| Lu | +3 | 0.98 |
| Yb | +3 | 0.99 |
| Tm | +3 | 0.99 |
| Er | +3 | 1.00 |
| Y | +3 | 1.02 |
| Ho | +3 | 1.02 |
| Dy | +3 | 1.03 |
| Tb | +3 | 1.04 |
| Gd | +3 | 1.05 |
| Eu | +3 | 1.07 |
| Sm | +3 | 1.08 |
| Bi | +3 | 1.17 |
| Na | +1 | 1.18 |
| Pb | +2 | 1.29 |

FIG. 4

| | B blend ratio "x" (mol %) | Na blend ratio "y" (mol %) | Bi blend ratio "z" (mol %) | K blend ratio (mol %) | Blended Na ratio "y/(y+z)" | Relation between y/(y+z) and x | Note |
|---|---|---|---|---|---|---|---|
| Example 2-1 | 7.0 | 25.4 | 51.6 | - | 0.33 | y/(y+z) ≤ 0.0143x+0.24 | |
| Example 2-2 | 7.0 | 15.4 | 61.6 | - | 0.20 | y/(y+z) ≤ 0.0143x+0.24 | |
| Example 2-3 | 7.0 | 2.8 | 53.9 | 20.3 | 0.05 | y/(y+z) ≤ 0.0143x+0.24 | |
| Example 2-4 | 2.0 | 21.4 | 60.8 | - | 0.26 | y/(y+z) ≤ 0.0143x+0.24 | |
| Example 2-5 | 2.0 | 3.0 | 57.5 | 21.6 | 0.05 | y/(y+z) ≤ 0.0143x+0.24 | |
| Example 2-6 | 12.0 | 28.8 | 43.1 | - | 0.40 | y/(y+z) ≤ 0.0143x+0.24 | |
| Example 2-7 | 12.0 | 14.4 | 57.5 | - | 0.20 | y/(y+z) ≤ 0.0143x+0.24 | |
| Example 2-8 | 12.0 | 2.6 | 50.3 | 18.9 | 0.05 | y/(y+z) ≤ 0.0143x+0.24 | |
| Comparative Example 2-1 | 13.0 | 28.4 | 42.5 | - | 0.40 | y/(y+z) ≤ 0.0143x+0.24 | crystal defects emerged on the single crystal film |
| Comparative Example 2-2 | 13.0 | 2.5 | 49.4 | 18.9 | 0.05 | y/(y+z) ≤ 0.0143x+0.24 | crystal defects emerged on the single crystal film |
| Comparative Example 2-3 | 12.0 | 32.4 | 39.5 | - | 0.45 | y/(y+z) > 0.0143x+0.24 | sodium ferrite deposited in the melt |
| Comparative Example 2-4 | 7.0 | 30.8 | 46.2 | - | 0.40 | y/(y+z) > 0.0143x+0.24 | sodium ferrite deposited in the melt |
| Comparative Example 2-5 | 2.0 | 24.7 | 57.5 | - | 0.30 | y/(y+z) > 0.0143x+0.24 | sodium ferrite deposited in the melt |
| Comparative Example 2-6 | 1.0 | 21.6 | 61.6 | - | 0.26 | y/(y+z) > 0.0143x+0.24 | garnet deposited in the melt |
| Comparative Example 2-7 | 1.0 | 3.0 | 58.5 | 21.6 | 0.05 | y/(y+z) ≤ 0.0143x+0.24 | garnet deposited in the melt |

FIG. 6

| | Blend ratio "x" of Fe, Ga and Al (mol %) | Melting temperature (°C) | Growth temperature "y" (°C) | Bi amount "z" | Relation among y, y1 and y2 | Note |
|---|---|---|---|---|---|---|
| Example 3-1 | 14.0 | 900 | 750 | 1.00 | y1 < y < y2 | |
| Example 3-2 | 14.0 | 900 | 810 | 0.52 | y1 < y ≈ y2 | |
| Example 3-3 | 14.0 | 900 | 690 | 1.50 | y1 ≈ y < y2 | |
| Example 3-4 | 9.0 | 900 | 720 | 0.52 | y1 < y ≈ y2 | |
| Example 3-5 | 9.0 | 900 | 660 | 1.00 | y1 < y < y2 | |
| Example 3-6 | 9.0 | 900 | 600 | 1.50 | y1 ≈ y < y2 | |
| Example 3-7 | 19.0 | 950 | 900 | 0.52 | y1 < y ≈ y2 | |
| Example 3-8 | 19.0 | 950 | 840 | 1.00 | y1 < y < y2 | |
| Example 3-9 | 19.0 | 950 | 780 | 1.50 | y1 ≈ y < y2 | |
| Example 3-10 | 22.0 | 950 | 900 | 1.50 | y1 < y < y2 | |
| Example 3-11 | 25.5 | 950 | 900 | 1.50 | y1 ≈ y < y2 | |
| Comparative Example 3-1 | 25.5 | 980 | - | | - | no growth due to crucible deformation |
| Comparative Example 3-2 | 25.5 | 950 | 880 | | y < y1 < y2 | crystal defects emerged on single crystal film |
| Comparative Example 3-3 | 19.0 | 980 | - | | - | no growth due to crucible deformation |
| Comparative Example 3-4 | 19.0 | 950 | 750 | | y < y1 < y2 | crystal defects emerged on single crystal film |
| Comparative Example 3-5 | 9.0 | 900 | 750 | 0.40 | y < y2 < y | small rotation coefficient of single crystal film |
| Comparative Example 3-6 | 9.0 | 900 | 580 | | y < y1 < y2 | crystal defects emerged on single crystal film |
| Comparative Example 3-7 | 8.0 | 900 | 720 | | y1 < y2 < y | small growth rate of single crystal film |
| Comparative Example 3-8 | 8.0 | 900 | 600 | | y1 < y < y2 | small growth rate of single crystal film |

MAGNETIC GARNET SINGLE CRYSTAL AND OPTICAL ELEMENT USING SAME AS WELL AS METHOD OF PRODUCING SINGLE CRYSTAL

TECHNICAL FIELD

The present invention relates to a magnetic garnet single crystal prepared by the flux process and an optical element using the same as well as a method of producing the single crystal.

BACKGROUND ART

Faraday rotator as an optical element with a function to rotate the polarization plane of transmitting light is used in optical devices such as optical isolator, optical attenuator, optical circulator and photo-magnetic field sensor for communication. Faraday rotator is generally prepared by using a plane-like bismuth (Bi)-substituted rare-earth iron garnet single crystal. The Bi-substituted rare-earth iron garnet single crystal is prepared by the liquid phase epitaxial (LPE) process as one of flux processes. Single crystals are grown at atmospheric pressure by the flux processes.

In growing the Bi-substituted rare-earth iron garnet single crystal by the solution process such as the flux processes, generally, PbO, $Bi_2O_3$ and $B_2O_3$ are used as the solvents so as to stably grow such garnet single crystal while the solvents are maintained at their supersaturation states. During the growth of the magnetic garnet single crystal, therefore, a small amount of lead (Pb) contaminates in the resulting crystal. In Faraday rotators for use in optical devices for communication, magnetic garnet single crystals at a Pb content "y" of about 0.03 to 0.06 in the chemical formula $Bi_{3-x-y}M1_xPb_yFe_{5-z-w}M2_zM3_wO_{12}$ have been used conventionally.

Patent Reference 1: JP-A-2001-044026

Patent Reference 2: JP-A-2001-044027.

DISCLOSURE OF INVENTION

Problem to be Solved by the Invention

Following the upsurge in the recent environmental protection movement, however, efforts are now directed toward the reduction of the content of Pb as an environmental load substance in any of industrial products. Therefore, a trace amount of contaminating Pb in magnetic garnet single crystals grown by the LPE process draws concerns as a potential factor of environmental pollution. Therefore, it is necessary to reduce or eliminate the amount of Pb contained in magnetic garnet single crystals as materials constituting Faraday rotators.

It is an object of the present invention to provide a magnetic garnet single crystal at a reduced Pb content and an optical element using the same as well as a method of producing the magnetic garnet single crystal.

Means for Solving the Problem

The object is attained with a magnetic garnet single crystal grown by the liquid phase epitaxial growth process, which is represented by the chemical formula $Bi_xNa_yPb_zM1_{3-x-y-z}Fe_{5-w}M2_wO_{12}$ (M1 is at least one element selected from Y, Sm, Eu, Gd, Tb, Dy, Ho, Er, Tm, Yb and Lu; and M2 is at least one element selected from Ga, Al, In, Ti, Ge, Si and Pt, provided that $0.5<x\leq2.0$, $0<y\leq0.8$, $0\leq z<0.01$, $0.19\leq3-x-y-z<2.5$, and $0\leq w\leq1.6$).

The magnetic garnet single crystal in accordance with the invention is characteristic in that the "y" satisfies the relation of $0<y\leq0.05$.

The object is attained with an optical element prepared by using the magnetic garnet single crystal in accordance with the invention.

Furthermore, the object is attained by a method of producing the magnetic garnet single crystal comprising preparing a melt containing Na, and growing the magnetic garnet single crystal by the liquid phase epitaxial growing process using the melt.

The object is attained by a method of producing the garnet single crystal comprising preparing a solution containing B, Na and Bi and growing the garnet single crystal using the solution, wherein the Na blend ratio "y" (in mol %) and the Bi blend ratio "z" (in mol %) satisfy the formula $0<y/(y+z)\leq0.41$.

The object is attained by a method of producing the garnet single crystal comprising preparing a solution containing B, Na and Bi, where the B blend ratio "x" (in mol %), the Na blend ratio "y" (in mol %) and the Bi blend ratio "z" (in mol %) satisfy the relation of $0<y/(y+z)\leq0.0143x+0.24$, and growing the garnet single crystal using the solution.

The method of producing the garnet single crystal is characteristic in that the blend ratio "x" is 2.0 mol % or more to 12.0 mol % or less.

The object is attained by a method of producing the garnet single crystal comprising preparing a solution containing B, Na and Bi, wherein the B blend ratio "x" is 2.0 mol % or more to 12.0 mol % or less, and growing the garnet single crystal using the solution.

The object is attained by a method of producing the magnetic garnet single crystal comprising preparing a solution by dissolving at least one element (essentially including Fe) of Fe, Ga and Al at a blend ratio of 9.0 mol % or more to 25.5 mol % or less in a solvent containing Na, Bi and B, and growing the magnetic garnet single crystal using the solution.

The object is attained by a method of producing the magnetic garnet single crystal comprising preparing a solution by dissolving at least one element (essentially including Fe) of Fe, Ga and Al in a solvent containing Na, Bi and B, and growing the magnetic garnet single crystal using the solution at a growth temperature of 600° C. or more to 900° C. or less.

The object is attained by a method of producing the magnetic garnet single crystal comprising preparing a solution by dissolving at least one element (essentially including Fe) of Fe, Ga and Al at a blend ratio "x" (in mol %) in a solvent containing Na, Bi and B, and growing the magnetic garnet single crystal using the solution at a growth temperature "y" (° C.) satisfying the relation of $436+18.2x\leq y\leq555+18.2x$.

The method of producing the magnetic garnet single crystal in accordance with the invention is characteristic in that the blend ratio "x" is 9.0 mol % or more and the growth temperature "y" is 900° C. or less.

The method of producing the magnetic garnet single crystal in accordance with the invention is characteristic in that the solution is prepared in a crucible made of Au.

The object is attained by a method of producing the single crystal comprising charging materials including Na in a crucible made of Au, melting the materials to prepare a melt and growing the single crystal using the melt.

The method of producing the single crystal is characteristic in that the single crystal is grown at atmospheric pressure.

The method of producing the single crystal is characteristic in that the materials further contain B.

The method of producing the single crystal is characteristic in that the single crystal is a rare-earth iron garnet single crystal.

EFFECT OF THE INVENTION

In accordance with the invention, the Pb content in the resulting magnetic garnet single crystal and the like for use in Faraday rotator can be reduced or completely eliminated.

BEST MODE FOR CARRYING OUT THE INVENTION

[First Mode for Carrying Out the Invention]

A magnetic garnet single crystal and an optical element using the same as well as a method of producing the magnetic garnet single crystal in a first mode for carrying out the invention is now described with reference to FIGS. 1 and 2. As the solvent for use in growing magnetic garnet single crystal films by the liquid phase epitaxial process, generally, PbO, $B_2O_3$ and $Bi_2O_3$ are used. Bi is the main element constituting the magnetic garnet single crystal for use in Faraday rotator, and has functions as both of a solvent and a solute. As the main solute, use is made of oxides of various rare earth elements, $Fe_2O_3$, and oxides of non-magnetic elements which can be substituted with Fe. The rare earth elements in this specification are for example Y, Sm, Eu, Gd, Tb, Dy, Ho, Er, Tm, Yb and Lu, which together with Fe can constitute garnet single crystals in a stable manner even when each of these elements is used alone. The non-magnetic elements which can be substituted with Fe are for example Ga, Al, In, Ti, Ge, Si and Pt.

FIG. 1 shows a table depicting the valence number and ion radius of each of the elements potentially entering in the magnetic garnet single crystal in the first mode for carrying out the invention. Pb at a state of a cation (positive ion) with divalent charge enters in the magnetic garnet single crystal film during the growth of the single crystal. Because the cations of Bi and rare earth elements constituting the magnetic garnet single crystal are essentially trivalent, the charge balance is deteriorated when the Pb cation with divalence enters in the garnet single crystal. When cations with tetravalence and with a potency to enter in the garnet single crystal exists in the melt, the cations are incorporated into the garnet single crystal in such a manner that the cations may complement the divalent charge of the Pb cation. Because Pb has a larger ion radius than those of rare earth elements, herein, only a trace amount of the Pb cation enters in the rare-earth iron garnet single crystal compared with the ratio of the Pb cation occupying the solution.

At a state of a cation with monovalent charge, Na enters in the magnetic garnet single crystal during the growth of the single crystal. Like Pb, cations with tetra-valent charge are incorporated into the magnetic garnet single crystal to complement the monovalent Na charge entering in the magnetic garnet single crystal. The ion radius of Na is larger than those of general rare earth elements but smaller than that of Pb. Hence, Na enters rather hardly in the magnetic garnet single crystal than rare earth elements but more easily enters therein in a more stable manner than Pb.

Na and Pb both have smaller charge valences than those of rare earth elements in magnetic garnet single crystals and are also elements with larger ion radii. Because the ion radius of Na is closer to the ion radii of rare earth elements than that of Pb, Na tends to enter in garnet single crystals more easily than Pb in case that Pb and Na concurrently exist in a melt for growing such single crystals. Na cation and Pb cation characteristically have smaller charge valences than the cation valences of rare earth elements, but Na so preferentially enters in garnet single crystals that Na effectively blocks Pb to enter in garnet single crystals. Accordingly, the addition of Na to magnetic garnet single crystals can reduce the Pb amount to enter in garnet single crystals down to less than 0.01.

In July 2006, the RoHS (Restriction on Hazardous Substances) rule for regulating the use of hazardous substances in electric and electronic appliances will be enforced. The maximum Pb permissible dose defined by the RoHS rule is 1,000 ppm in weight ratio. When the Pb amount in the formula is less than 0.01 in the composition of the magnetic garnet single crystal in this mode for carrying out the invention, the Pb amount in such final products will possibly be at the maximum permissible dose or less. According to this mode for carrying out the invention, optical elements satisfying the RoHS rule can be obtained.

Because many of substances containing Na and oxygen dissolve at lower temperatures than other oxides, these substances are also effective as solvents for growing magnetic garnet single crystals. In a magnetic garnet single crystal grown in a solvent containing Na and OH, for example, the Na has entered in the magnetic garnet single crystal. Therefore, the resulting magnetic garnet single crystal is of an excellent quality with no defects or cracks. By eliminating PbO from the materials of a solvent and using then a substance containing Na together with $Bi_2O_3$ and $B_2O_3$ as a solvent for growing a magnetic garnet single crystal with Na entering therein, a magnetic garnet single crystal from which Pb is completely eliminated preliminarily can be obtained.

In case that a magnetic garnet single crystal is to be grown in a solvent containing Na, compared with a solvent without any Na, the resulting solution can be retained more stably at the supersaturation state. Therefore, Bi up to about 2.0 in the chemical formula can enter in such garnet single crystal. So as to obtain a sufficient rotation coefficient (deg/μm) as a Faraday rotator, Bi at 0.5 or more in the chemical formula is required.

When non-magnetic elements are substituted at an amount more than 1.6 in the chemical formula with Fe to enter in a magnetic garnet single crystal, the Curie point of the magnetic garnet single crystal is lowered down to a temperature level around ambient temperature, so that the resulting magnetic garnet single crystal can not be used as Faraday rotator. Thus, the amount of non-magnetic elements to be substituted with Fe is essentially adjusted to 1.6 or less in the chemical formula.

When Na enters at a larger amount in a magnetic garnet single crystal, ions of for example Ti, Ge, Si and Pt with stable tetra-valent charge should be incorporated along with Na into a magnetic garnet single crystal so as to balance the charge of the resulting magnetic garnet single crystal. So as to allow Na at an amount of 0.8 or more in the chemical formula to enter in a magnetic garnet single crystal, ions stable at tetra-valent states should enter at 1.6 or more in the chemical formula in a magnetic garnet single crystal. When elements such as Ti, Ge, Si and Pt which can be substituted with Fe exist at 1.6 or more in the chemical formula, the Curie point of the resulting magnetic garnet single crystal is lowered down to ambient temperature or less, so that the magnetic garnet single crystal can not be used as Faraday rotator. Hence, the amount of Na entering in a magnetic garnet single crystal should be adjusted to 0.8 at maximum in the chemical formula.

In another point of view, the insertion loss of a Faraday rotator prepared by using a magnetic garnet single crystal with much Na preliminarily entering therein is increased. So as to obtain a Faraday rotator with a small insertion loss, thus, the amount of Na entering in a magnetic garnet single crystal is preferably adjusted to 0.05 or less in the chemical formula.

Elements such as La, Ce, Pr, Nd and Pm involve much difficulty in singly forming a magnetic garnet single crystal together with Fe but can enter as a part of constituting elements of a magnetic garnet single crystal.

A magnetic garnet single crystal in this mode for carrying out the invention, an optical element using the same and a method of producing the magnetic garnet single crystal are specifically described below in Examples 1-1 through 1-12 with reference to FIG. 1.

EXAMPLE 1-1

FIG. 2 depicts a part of the production process of a magnetic garnet single crystal. As shown in FIG. 2, $Gd_2O_3$, $Yb_2O_3$, $Fe_2O_3$, $B_2O_3$, $Bi_2O_3$ and NaOH were charged in a gold crucible "4" and placed in an electric furnace. By raising the furnace temperature to 950° C., the materials in the crucible 4 were dissolved. The resulting melt "8" was agitated with a gold agitator device.

As a substrate for growing a magnetic garnet single crystal thereon, a single crystal wafer prepared from an ingot of a garnet single crystal grown by the pulling method is used. In this Example, a CaMgZr-substituted GGG (gadolinium.gallium.garnet) single crystal substrate $[(GdCa)_3(GaMgZr)_5O_{12}]$ "10" is used as the substrate for growing the single crystal.

Arranging the CaMgZr-substituted GGG substrate 10 onto a gold fixing device "2" and then charging the substrate into a furnace, the furnace temperature was lowered down to 745° C. Then, a single face of the substrate 10 was put in contact with the melt 8 to allow epitaxial growth for 40 hours. A Bi-substituted rare-earth iron garnet single crystal (magnetic garnet single crystal) film "12" of a film thickness of 500 μm was obtained. The grown single crystal was compositionally analyzed by X-ray fluorescence analysis. The composition was $Bi_{1.30}Gd_{1.20}Yb_{0.50}Fe_{5.00}O_{12}$, with Na detected, while the composition could not absolutely be determined. Further, no Pb was detected. The composition was examined in detail by the ICP (inductively coupled plasma) analysis, with the Na content determined. Consequently, it was shown that the chemical formula of the magnetic garnet single crystal was $(BiGdYb)_{2.998}Na_{0.002}Fe_{5.000}O_{12}$. Thus, it was confirmed that no Pb was contained in the single crystal. By processing the grown single crystal film 12, a single crystal plate with a Faraday rotation angle of 45 degrees (abbreviated as "deg" hereinafter) toward the beam at a wavelength of 1.55 μm was prepared. A non-reflective coat (reflection-blocking film) was filmed on the polished face of the resulting single crystal plate. By directing the beam of a wavelength of 1.55 μm incident on the resulting Faraday rotator, the optical performance of the Faraday rotator was examined. It was shown that the Faraday rotator had such optical performance totally not problematic as a Faraday rotator.

EXAMPLE 1-2

$Gd_2O_3$, $Yb_2O_3$, $Fe_2O_3$, $B_2O_3$, $GeO_2$, $Bi_2O_3$, PbO and NaOH were charged in a gold crucible 4 and placed in an electric furnace. By raising the furnace temperature to 950° C., the materials in the crucible 4 were dissolved to prepare a melt 8, which was agitated with a gold agitator device. Arranging a CaMgZr-substituted GGG substrate 10 onto a gold fixing device 2 and then charging the substrate into a furnace, the furnace temperature was lowered down to 745° C. Then, a single face of the substrate 10 was put in contact with the melt 8 to allow epitaxial growth for 40 hours. A magnetic garnet single crystal film "12" of a film thickness of 500 μm was obtained. The grown single crystal film was compositionally analyzed by X-ray fluorescence analysis. The composition was $Bi_{1.30}Gd_{1.18}Yb_{0.50}Na_{0.02}Fe_{4.95}Ge_{0.05}O_{12}$, with Pb detected, while the composition could not be absolutely determined. The composition was examined in detail by the ICP analysis, with the Pb content determined. Consequently, it was shown that the chemical formula of the magnetic garnet single crystal was $(BiGdYbNa)_{2.991}Pb_{0.009}(FeGe)_{5.000}O_{12}$. Thus, it was confirmed that the Pb content was extremely less. By processing the grown single crystal film 12, a single crystal plate with a rotation angle of 45 deg toward the beam at a wavelength of 1.55 μm was prepared. A non-reflective coat was filmed on the polished face of the resulting single crystal plate, to prepare a Faraday rotator. By directing the beam of a wavelength of 1.55 μm incident on the resulting Faraday rotator, the optical performance of the Faraday rotator was examined. It was shown that the Faraday rotator had such optical performance totally not problematic as a Faraday rotator.

EXAMPLE 1-3

$Tb_4O_7$, $Ho_2O_3$, $Fe_2O_3$, $B_2O_3$, $Bi_2O_3$ and NaOH were charged in a gold crucible 4 and placed in an electric furnace. By raising the furnace temperature to 950° C., the materials in the crucible 4 were dissolved to prepare a melt 8, which was agitated with a gold agitator device. Arranging a CaMgZr-substituted GGG substrate 10 onto a gold fixing device 2 and then charging the substrate into a furnace, the furnace temperature was lowered down to 775° C. Then, a single face of the substrate 10 was put in contact with the melt 8 to allow epitaxial growth for 40 hours. A magnetic garnet single crystal film 12 of a film thickness of 510 μm was obtained. The grown single crystal film was compositionally analyzed by X-ray fluorescence analysis. The composition was $Bi_{1.04}Tb_{1.67}Ho_{0.29}Fe_{5.00}O_{12}$, with Na detected, while the composition could not be absolutely determined. The composition was examined in detail by the ICP analysis, with the Na content determined. Consequently, it was shown that the chemical formula of the magnetic garnet single crystal was $(BiTbHo)_{2.998}Na_{0.002}Fe_{5.000}O_{12}$. Thus, it was confirmed that no Pb was contained in the single crystal. By processing the grown single crystal film 12, a single crystal plate with a rotation angle of 45 deg toward the beam at a wavelength of 1.55 μm was prepared. A non-reflective coat was filmed on the polished face of the resulting single crystal plate, to prepare a Faraday rotator. By directing the beam of a wavelength of 1.55 μm incident on the resulting Faraday rotator, the optical performance of the Faraday rotator was examined. It was shown that the Faraday rotator had such optical performance totally not problematic as a Faraday rotator.

EXAMPLE 1-4

$Eu_2O_3$, $Lu_2O_3$, $Fe_2O_3$, $B_2O_3$, $Bi_2O_3$ and NaOH were charged in a gold crucible 4 and placed in an electric furnace. By raising the furnace temperature to 950° C., the materials in the crucible 4 were dissolved to prepare a melt 8, which was agitated with a gold agitator device. Arranging a CaMgZr-substituted GGG substrate 10 onto a gold fixing device 2 and then charging the substrate into a furnace, the furnace temperature was lowered down to 810° C. Then, a single face of the substrate 10 was put in contact with the melt 8 to allow epitaxial growth for 35 hours. A magnetic garnet single crystal film 12 of a film thickness of 450 μm was obtained. The grown single crystal was compositionally analyzed by X-ray fluorescence analysis. The composition was $Bi_{0.76}Eu_{1.70}Lu_{0.54}Fe_{5.00}O_{12}$, with Na detected, while the composition could not be absolutely determined. The composition was examined in detail by the ICP analysis, with the Na content determined. Consequently, it was shown that the chemical formula of the magnetic garnet single crystal was $(BiEuLu)_{2.998}Na_{0.002}Fe_{5.000}O_{12}$, with no Pb contained in the single crystal. By processing the grown single crystal film 12, a single crystal plate with a rotation angle of 45 deg toward the beam at a wavelength of 1.31 μm was prepared. A non-reflective coat was filmed on the polished face of the resulting single crystal plate, to prepare a Faraday rotator. By directing the beam of a wavelength of 1.31 μm incident on the resulting Faraday rotator, the optical performance of the Faraday rotator was examined. It was shown that the Faraday rotator had such optical performance totally not problematic as a Faraday rotator.

EXAMPLE 1-5

$Dy_2O_3$, $Y_2O_3$, $Sm_2O_3$, $Fe_2O_3$, $B_2O_3$, $Bi_2O_3$ and NaOH were charged in a gold crucible 4 and placed in an electric furnace. By raising the furnace temperature to 950° C., the materials in the crucible 4 were dissolved to prepare a melt 8, which was agitated with a gold agitator device. Arranging a CaMgZr-substituted GGG substrate 10 onto a gold fixing device 2 and then charging the substrate into a furnace, the furnace temperature was lowered down to 745° C. Then, a single face of the substrate 10 was put in contact with the melt 8 to allow epitaxial growth for 40 hours. A magnetic garnet single crystal film 12 of a film thickness of 450 μm was obtained. The grown single crystal was compositionally analyzed by X-ray fluorescence analysis. The composition was $Bi_{1.29}Dy_{1.20}Y_{0.41}Sm_{0.10}Fe_{5.00}O_{12}$, with Na detected, while the composition could not be absolutely determined. The composition was examined in detail by the ICP analysis, with the Na content determined. Consequently, it was shown that the chemical formula of the magnetic garnet single crystal was $(BiDyYSm)_{2.998}Na_{0.002}Fe_{5.000}O_{12}$, with no Pb contained in the single crystal. By processing the grown single crystal film 12, a single crystal plate with a rotation angle of 45 deg toward the beam at a wavelength of 1.55 μm was prepared. A non-reflective coat was filmed on the polished face of the resulting single crystal plate, to prepare a Faraday rotator. By directing the beam of a wavelength of 1.55 μm incident on the resulting Faraday rotator, the optical performance of the Faraday rotator was examined. It was shown that the Faraday rotator had such optical performance totally not problematic as a Faraday rotator.

EXAMPLE 1-6

$Gd_2O_3$, $Er_2O_3$, $Tm_2O_3$, $Fe_2O_3$, $B_2O_3$, $Bi_2O_3$ and NaOH were charged in a gold crucible 4 and placed in an electric furnace. By raising the furnace temperature to 950° C., the materials in the crucible 4 were dissolved to prepare a melt 8, which was agitated with a gold agitator device. Arranging a CaMgZr-substituted GGG substrate 10 onto a gold fixing device 2 and then charging the substrate into a furnace, the furnace temperature was lowered down to 710° C. Then, a single face of the substrate 10 was put in contact with the melt 8 to allow epitaxial growth for 20 hours. A magnetic garnet single crystal film 12 of a film thickness of 300 μm was obtained. The grown single crystal was compositionally analyzed by X-ray fluorescence analysis. The composition was $Bi_{1.60}Gd_{0.27}Er_{0.73}Tm_{0.40}Fe_{5.00}O_{12}$, with Na detected, while the composition could not be absolutely determined. The composition was examined in detail by the ICP analysis, with the Na content determined. Consequently, it was shown that the chemical formula of the magnetic garnet single crystal was $(BiGdErTm)_{2.998}Na_{0.002}Fe_{5.000}O_{12}$, with no Pb contained in the single crystal. By processing the grown single crystal film 12, a single crystal plate with a rotation angle of 45 deg toward the beam at a wavelength of 1.31 μm was prepared. A non-reflective coat was filmed on the polished face of the resulting single crystal plate, to prepare a Faraday rotator. By directing the beam of a wavelength of 1.31 μm incident on the resulting Faraday rotator, the optical performance of the Faraday rotator was examined. It was shown that the Faraday rotator had such optical performance totally not problematic as a Faraday rotator.

EXAMPLE 1-7

$Gd_2O_3$, $Yb_2O_3$, $Fe_2O_3$, $Ga_2O_3$, $B_2O_3$, $Bi_2O_3$ and NaOH were charged in a gold crucible 4 and placed in an electric furnace. By raising the furnace temperature to 950° C., the materials in the crucible 4 were dissolved to prepare a melt 8, which was agitated with a gold agitator device. Arranging a CaMgZr-substituted GGG substrate 10 onto a gold fixing device 2 and then charging the substrate into a furnace, the furnace temperature was lowered down to 786° C. Then, a single face of the substrate 10 was put in contact with the melt 8 to allow epitaxial growth for 40 hours. A magnetic garnet single crystal film 12 of a film thickness of 550 μm was obtained. The grown single crystal was compositionally analyzed by X-ray fluorescence analysis. The composition was $Bi_{0.95}Gd_{1.67}Yb_{0.38}Fe_{4.80}Ga_{0.20}O_{12}$, with Na detected, while the composition could not be absolutely determined. The composition was examined in detail by the ICP analysis, with the Na content determined. Consequently, it was shown that the chemical formula of the magnetic garnet single crystal was $(BiGdYb)_{2.998}Na_{0.002}(FeGa)_{5.000}O_{12}$, with no Pb contained in the single crystal. By processing the grown single crystal film 12, a single crystal plate with a rotation angle of 45 deg toward the beam at a wavelength of 1.55 μm was prepared. A non-reflective coat was filmed on the polished face of the resulting single crystal plate, to prepare a Faraday rotator. By directing the beam of a wavelength of 1.55 μm incident on the resulting Faraday rotator, the optical performance of the Faraday rotator was examined. It was shown that the Faraday rotator had such optical performance totally not problematic as a Faraday rotator.

EXAMPLE 1-8

$Gd_2O_3$, $Yb_2O_3$, $Fe_2O_3$, $Al_2O_3$, $B_2O_3$, $Bi_2O_3$ and NaOH were charged in a gold crucible 4 and placed in an electric furnace. By raising the furnace temperature to 950° C., the materials in the crucible 4 were dissolved to prepare a melt 8, which was agitated with a gold agitator device. Arranging a CaMgZr-substituted GGG substrate 10 onto a gold fixing device 2 and then charging the substrate into a furnace, the furnace temperature was lowered down to 772° C. Then, a single face of the substrate 10 was put in contact with the melt 8 to allow epitaxial growth for 40 hours. A magnetic garnet single crystal film 12 of a film thickness of 530 μm was obtained. The grown single crystal was compositionally analyzed by X-ray fluorescence analysis. The composition was $Bi_{1.07}Gd_{1.67}Yb_{0.26}Fe_{4.80}Al_{0.20}O_{12}$, with Na detected, while the composition could not be absolutely determined. The composition was examined in detail by the ICP analysis, with the Na content determined. Consequently, it was shown that the chemical formula of the magnetic garnet single crystal was $(BiGdYb)_{2.998}Na_{0.002}(FeAl)_{5.000}O_{12}$, with no Pb contained in the single crystal. By processing the grown single crystal film 12, a single crystal plate with a rotation angle of 45 deg toward the beam at a wavelength of 1.55 μm was prepared. A non-reflective coat was filmed on the polished face of the resulting single crystal plate, to prepare a Faraday rotator. By directing the beam of a wavelength of 1.55 μm incident on the resulting Faraday rotator, the optical performance of the Faraday rotator was examined. It was shown that the Faraday rotator had such optical performance totally not problematic as a Faraday rotator.

EXAMPLE 1-9

$Gd_2O_3$, $Yb_2O_3$, $Fe_2O_3$, $In_2O_3$, $B_2O_3$, $Bi_2O_3$ and NaOH were charged in a gold crucible 4 and placed in an electric furnace. By raising the furnace temperature to 950° C., the materials in the crucible 4 were dissolved to prepare a melt "8", which was agitated with a gold agitator device. Arranging a CaMgZr-substituted GGG substrate 10 onto a gold fixing device 2 and then charging the substrate into a furnace, the furnace temperature was lowered down to 805° C. Then, a single face of the substrate 10 was put in contact with the melt 8 to allow epitaxial growth for 45 hours. A magnetic garnet single crystal film 12 of a film thickness of 500 μm was obtained. The grown single crystal was compositionally analyzed by X-ray fluorescence analysis. The composition was $Bi_{0.79}Gd_{1.67}Yb_{0.54}Fe_{4.90}In_{0.10}O_{12}$, with Na detected, while the composition could not be absolutely determined. The composition was examined in detail by the ICP analysis, with the Na content determined. Consequently, it was shown that the chemical formula of the magnetic garnet single crystal was $(BiGdYb)_{2.998}Na_{0.002}(FeIn)_{5.000}O_{12}$, with no Pb contained in the single crystal. By processing the grown single crystal film 12, a single crystal plate with a rotation angle of 45 deg toward the beam at a wavelength of 1.31 μm was prepared. A non-reflective coat was filmed on the polished face of the resulting single crystal plate, to prepare a Faraday rotator. By directing the beam of a wavelength of 1.31 μm incident on the resulting Faraday rotator, the optical performance of the Faraday rotator was examined. It was shown that the Faraday rotator had such optical performance totally not problematic as a Faraday rotator.

EXAMPLE 1-10

$Gd_2O_3$, $Yb_2O_3$, $Fe_2O_3$, $GeO_2$, $B_2O_3$, $Bi_2O_3$ and NaOH were charged in a gold crucible 4 and placed in an electric furnace. By raising the furnace temperature to 950° C., the materials in the crucible 4 were dissolved to prepare a melt 8, which was agitated with a gold agitator device. Arranging a CaMgZr-substituted GGG substrate 10 onto a gold fixing device 2 and then charging the substrate into a furnace, the furnace temperature was lowered down to 790° C. Then, a single face of the substrate 10 was put in contact with the melt 8 to allow epitaxial growth for 42 hours. A magnetic garnet single crystal film 12 of a film thickness of 570 μm was obtained. The grown single crystal was compositionally analyzed by X-ray fluorescence analysis. The composition was $Bi_{0.93}Gd_{1.67}Yb_{0.20}Na_{0.20}Fe_{4.60}Ge_{0.40}O_{12}$, with no Pb contained in the single crystal. By processing the grown single crystal film 12, a single crystal plate with a rotation angle of 45 deg toward the beam at a wavelength of 1.55 μm was prepared. A non-reflective coat was filmed on the polished face of the resulting single crystal plate, to prepare a Faraday rotator. By directing the beam of a wavelength of 1.55 μm incident on the resulting Faraday rotator, the optical performance of the Faraday rotator was examined. It was shown that the Faraday rotator had such optical performance totally not problematic as a Faraday rotator.

EXAMPLE 1-11

$Gd_2O_3$, $Yb_2O_3$, $Fe_2O_3$, $TiO_2$, $SiO_2$, $B_2O_3$, $Bi_2O_3$ and NaOH were charged in a platinum crucible 4 and placed in an electric furnace. By raising the furnace temperature to 950° C., the materials in the crucible 4 were dissolved to prepare a melt 8, which was agitated with a gold agitator device. Arranging a CaMgZr-substituted GGG substrate 10 onto a gold fixing device 2 and then charging the substrate into a furnace, the furnace temperature was lowered down to 746° C. Then, a single face of the substrate 10 was put in contact with the melt 8 to allow epitaxial growth for 36 hours. A magnetic garnet single crystal film 12 of a film thickness of 480 μm was obtained. The grown single crystal was compositionally analyzed by X-ray fluorescence analysis. The composition was $Bi_{1.28}Gd_{1.20}Yb_{0.50}Na_{0.02}Fe_{4.96}Ti_{0.01}Si_{0.01}Pt_{0.02}O_{12}$, with no Pb contained in the single crystal. By processing the grown single crystal film 12, a single crystal plate with a rotation angle of 45 deg toward the beam at a wavelength of 1.55 μm was prepared. A non-reflective coat was filmed on the polished face of the resulting single crystal plate, to prepare a Faraday rotator. By directing the beam of a wavelength of 1.55 μm incident on the resulting Faraday rotator, the optical performance of the Faraday rotator was examined. It was shown that the Faraday rotator had such optical performance totally not problematic as a Faraday rotator.

EXAMPLE 1-12

$Gd_2O_3$, $Yb_2O_3$, $Fe_2O_3$, $B_2O_3$, $Bi_2O_3$, NaOH and KOH were charged in a gold crucible 4 and placed in an electric furnace. By raising the furnace temperature to 950° C., the materials in the crucible 4 were dissolved to prepare a melt 8, which was agitated with a gold agitator device. Arranging a CaMgZr-substituted GGG substrate 10 onto a gold fixing device 2 and then charging the substrate into a furnace, the furnace temperature was lowered down to 745° C. Then, a single face of the substrate 10 was put in contact with the melt 8 to allow epitaxial growth for 40 hours. A magnetic garnet single crystal film 12 of a film thickness of 500 μm was obtained. The grown single crystal was compositionally analyzed by X-ray fluorescence analysis. The composition was $Bi_{1.30}Gd_{1.20}Yb_{0.50}Fe_{5.00}O_{12}$, with Na detected, while the composition could not be absolutely determined. Pb and K were not detected. Then, the composition was examined in detail by the ICP analysis, with the Na content determined. Consequently, it was shown that the chemical formula of the magnetic garnet single crystal was $(BiGdYb)_{2.998}Na_{0.002}Fe_{5.000}O_{12}$, with no Pb contained in the single crystal. By processing the grown single crystal film 12, a single crystal plate with a Faraday rotation angle of 45 deg toward the beam at a wavelength of 1.55 μm was prepared. A non-reflective coat was filmed on the polished face of the resulting single crystal plate, to prepare a Faraday rotator. By directing the beam of a wavelength of 1.55 μm incident on the resulting Faraday rotator, the optical performance of the Faraday rotator was examined. It was shown that the Faraday rotator had such optical performance totally not problematic as a Faraday rotator.

[Second Mode for Carrying Out the Invention]

A method of producing a magnetic garnet single crystal in a second mode for carrying out the invention is now described with reference to FIGS. 3 and 4. So as to thoroughly eliminate Pb contained at a trace amount in garnet single crystals, Pb contained in conventional solvents is replaced with sodium (Na) to grow a Bi-substituted rare-earth iron garnet single crystal from solvents containing Na, Bi and boron (B). Because only a short time has elapsed since the development of a technique for growing a garnet single crystal from solvents containing Na, Bi and B, the details of the growing conditions to grow a garnet single crystal in a stable manner have not yet been clearly demonstrated. Particularly, the growing conditions concerning Na, Bi and B as the solvent components have not yet been shown. Depending on the growing conditions, hence, disadvantages may occur, such as no yield of any garnet single crystal or the yield of garnet single crystals with numerous defects or cracks.

In this mode for carrying out the invention, attempts were made to grow garnet single crystals under various growing conditions such as various Na blend ratios or B blend ratios. The term "blend ratio" in this specification means the ratio of each element in molar number occupying the total molar number of the elements converting to cations (positive ions) in solutions, such as Na, Bi, B, iron (Fe), and rare earth elements to be charged in a crucible. When the molar number of B blended is defined as "a" and the total molar number of B, Bi, B, Fe and rare earth elements is defined as "b", then, the B blend ratio "x" is (100×a/b) in mol %. Given that the B blend ratio is defined as "x" (in mol %) while the Na blend ratio and the Bi blend ratio are defined as "x" in mol % and "z" in mol %, respectively, the blended Na ratio [y/(y+z)] was used as a parameter for the growing conditions in this mode for carrying out the invention.

FIG. 3 shows a graph depicting the relation between the B blend ratio "x" and the blended Na ratio [y/(y+z)]. The graph expresses the B blend ratio "x" (in mol %) on the crosswise axis, while expressing the blended Na ratio [y/(y+z)] on the longitudinal axis. By changing the B blend ratio "x", first, attempts were made to grow a garnet single crystal. When the B blend ratio "x" was smaller than 2.0 mol %, the supersaturation state could not be retained, so that when the temperature of the solution was lower than the saturation temperature, garnet was deposited in the solution to fail the growth of the single crystal. Under a condition that the B blend ratio "x" was 2.0 mol % or more, the supersaturation state could be retained so that a garnet single crystal could be grown. When the B blend ratio "x" was larger than 12.0 mol %, the viscosity of the solution increased, so that numerous cracks and defects emerged in the resulting garnet single crystal. It was indicated that when the B blend ratio "x" was 2.0 mol % or more to 12.0 mol % or less (on the lines "a" and "b" and in the zone between the lines in FIG. 3), a garnet single crystal without any cracks or defects could be grown in a stable manner.

By subsequently changing the blended Na ratio [y/(y+z)], then, attempts were made to examine conditions for growing a garnet single crystal. When the blended Na ratio [y/(y+z)] is relatively small, garnet was deposited in the solution. When the blended Na ratio [y/(y+z)] is larger, sodium ferrite ($NaFeO_2$) was deposited in the solution. The borderline between the conditions for depositing garnet and the conditions for depositing sodium ferrite varies depending on the B blend ratio "x". It was shown that in case that the blended Na ratio [y/(y+z)] and the B blend ratio "x" (in mol %) satisfied the relation of $y/(y+z) \leq 0.0143x+0.24$ (on the line "c" in FIG. 3 and in the zone below the line), garnet was deposited while sodium ferrite was deposited except for the case.

When the B blend ratio "x" increases, the value of the blended Na ratio [y/(y+z)] with a potency for garnet deposition increases. In a range of the B blend ratio "x" at 2.0 mol % or more to 12.0 mol % or less, the blended Na ratio [y/(y+z)] with a potency for garnet deposition reaches the maximum when the B blend ratio "x" was 12.0 mol %, which is about 0.41 (=0.0143 ×12.0+0.24). So as to grow garnet single crystals from solutions containing Na, Bi and B, it is at least required to adjust the blended Na ratio [y/(y+z)] to 0.41 or less (on the line "d" in FIG. 3 and in the zone below the line).

Garnet was deposited from a solvent at a smaller Na blend ratio "y", when potassium (K) was additionally added as a solvent to the solvent. It was shown that garnet single crystals could be grown in such manner, when the blended Na ratio [y/(y+z)] was larger than zero (the zone above the line "e" in FIG. 3).

It was thus shown that garnet single crystals could be grown in case that the blended Na ratio [y/(y+z)] was larger than zero but not more than 0.41 ($0 < y/(y+z) \leq 0.41$), particularly in case that the blended Na ratio [y/(y+z)] was larger than zero but not more than $0.0143x+0.24$ ($0 < y/(y+z) \leq 0.0143x+0.24$). It was additionally shown that garnet single crystals could be grown more stably in case that the blended Na ratio [y/(y+z)] was larger than zero but not more than $0.0143x+0.24$ and additionally that the B blend ratio "x" was 2.0 mol % or more to 12.0 mol % or less [$0 < y/(y+z) \leq 0.0143x+0.24$, $2.0 \text{ (mol \%)} \leq x \leq 12.0 \text{ (mol \%)}$].

As described above, garnet single crystals at reduced Pb contents therein can be grown in this mode for carrying out the invention. Additionally, Bi-substituted rare-earth iron garnet single crystals suitable for Faraday rotators can be grown in a stable fashion by using a solvent containing Na, Bi and B according to this mode.

The method of producing a garnet single crystal according to this mode for carrying out the invention is more specifically described below in Examples and Comparative Examples.

EXAMPLE 2-1

$Gd_2O_3$, $Yb_2O_3$, $Fe_2O_3$, $B_2O_3$, $Bi_2O_3$ and NaOH in total of 2.3 kg were charged in a crucible "4" made of gold (Au). The Fe blend ratio was 15.5 mol %. The B blend ratio "x", the Na blend ratio "y" and the Bi blend ratio "z" were 7.0 mol %, 25.4 mol % and 51.6 mol %, respectively. The blended Na ratio [y/(y+z)] was 0.33 ($\leq 0.0143x+0.24$). The crucible 4 with the materials charged therein was arranged in an electric furnace. By melting the materials in the crucible 4 by raising the furnace temperature to 900° C., the materials were agitated and a homogenous melt (solution) "8" was generated. A CaMgZr-substituted GGG (gadolinium.gallium.garnet) substrate "10" of a 2-inch diameter was mounted onto a fixing device "2" and then charged into a furnace. After lowering the temperature of the melt 8 to 770° C., a single face of the substrate 10 was put in contact with the melt 8 to allow epitaxial growth for 4 hours. Consequently, a single crystal film "12" without any defects and of a film thickness of 80 μm was obtained. The single crystal was compositionally analyzed by X-ray fluorescence analysis. The composition was $Bi_{1.00}Gd_{1.70}Yb_{0.30}Fe_{5.00}O_{12}$, with Na detected, while the composition could not absolutely be determined. The composition was examined in detail by the ICP (inductively coupled plasma) analysis. Consequently, it was shown that the chemical formula of the magnetic garnet single crystal was $(BiGdYb)_{2.998}Na_{0.002}Fe_{5.000}O_{12}$. It was shown that the magnetic garnet single crystal was a Bi-substituted rare-earth iron garnet single crystal for use in Faraday rotators.

EXAMPLE 2-2

$Gd_2O_3$, $Yb_2O_3$, $Fe_2O_3$, $B_2O_3$, $Bi_2O_3$ and NaOH in total of 2.3 kg were charged in a crucible 4 made of Au. The Fe blend ratio was 15.5 mol %. The B blend ratio "x", the Na blend ratio "y" and the Bi blend ratio "z" were 7.0 mol %, 15.4 mol % and 61.6 mol %, respectively. The blended Na ratio [y/(y+z)] was 0.20 ($\leq 0.0143x+0.24$). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 790° C., a single face of the substrate 10 was put in contact with the melt 8 to allow epitaxial growth for 4 hours. Consequently, a single crystal film 12 without any defects and of a film thickness of 80 μm was obtained. The single crystal was compositionally analyzed by X-ray fluorescence analysis. The composition was $Bi_{1.00}Gd_{1.70}Yb_{0.30}Fe_{5.00}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}Fe_{5.000}O_{12}$. It was shown that the magnetic garnet single crystal was a Bi-substituted rare-earth iron garnet single crystal for use in Faraday rotators.

EXAMPLE 2-3

$Gd_2O_3$, $Yb_2O_3$, $Fe_2O_3$, $B_2O_3$, $Bi_2O_3$, NaOH and KOH in total of 2.3 kg were charged in a crucible 4 made of Au. The Fe blend ratio was 15.5 mol %. The B blend ratio "x", the Na blend ratio "y", the Bi blend ratio "z" and the K blend ratio were 7.0 mol %, 2.8 mol %, 53.9 mol % and 20.3 mol %, respectively. The blended Na ratio [y/(y+z)] was 0.05 ($\leq 0.0143x+0.24$). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 770° C., a single face of the substrate 10 was put in contact with the melt 8 to allow epitaxial growth for 4 hours. Consequently, a single crystal film 12 without any defects and of a film thickness of 80 μm was obtained. The single crystal was compositionally analyzed by X-ray fluorescence analysis. The composition was $Bi_{1.00}Gd_{1.70}Yb_{0.30}Fe_{5.00}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}Fe_{5.000}O_{12}$. It was shown that the magnetic garnet single crystal was a Bi-substituted rare-earth iron garnet single crystal for use in Faraday rotators.

EXAMPLE 2-4

$Gd_2O_3$, $Yb_2O_3$, $Fe_2O_3$, $B_2O_3$, $Bi_2O_3$ and NaOH in total of 2.3 kg were charged in a crucible 4 made of Au. The Fe blend ratio was 15.5 mol %. The B blend ratio "x", the Na blend ratio "y", and the Bi blend ratio "z" were 2.0 mol %, 21.4 mol %, and 60.8 mol %, respectively. The blended Na ratio "y/(y+z)" was 0.26 ($\leq 0.0143x+0.24$). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 770° C., a single face of the substrate 10 was put in contact with the melt 8 to allow epitaxial growth for 4 hours. Consequently, a single crystal film 12 without any defects and of a film thickness of 50 μm was obtained. The single crystal was compositionally analyzed by X-ray fluorescence analysis. The composition was $Bi_{1.00}Gd_{1.70}Yb_{0.30}Fe_{5.00}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}Fe_{5.000}O_{12}$. It was shown that the magnetic garnet single crystal was a Bi-substituted rare-earth iron garnet single crystal for use in Faraday rotators.

EXAMPLE 2-5

$Gd_2O_3$, $Yb_2O_3$, $Fe_2O_3$, $B_2O_3$, $Bi_2O_3$, NaOH and KOH in total of 2.3 kg were charged in a crucible 4 made of Au. The Fe blend ratio was 15.5 mol %. The B blend ratio "x", the Na blend ratio "y", the Bi blend ratio "z" and the K blend ratio were 2.0 mol %, 3.0 mol %, 57.5 mol % and 21.6 mol %, respectively. The blended Na ratio [y/(y+z)] was 0.05 ($\leq 0.0143x+0.24$). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 770° C., a single face of the substrate 10 was put in contact with the melt 8 to allow epitaxial growth for 4 hours. Consequently, a single crystal film 12 without any defects and of a film thickness of 50 μm was obtained. The single crystal was compositionally analyzed by X-ray fluorescence analysis. The composition was $Bi_{1.00}Gd_{1.70}Yb_{0.30}Fe_{5.00}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}Fe_{5.000}O_{12}$. It was shown that the magnetic garnet single crystal was a Bi-substituted rare-earth iron garnet single crystal for use in Faraday rotators.

EXAMPLE 2-6

$Gd_2O_3$, $Yb_2O_3$, $Fe_2O_3$, $B_2O_3$, $Bi_2O_3$ and NaOH in total of 2.3 kg were charged in a crucible 4 made of Au. The Fe blend ratio was 15.5 mol %. The B blend ratio "x", the Na blend ratio "y", and the Bi blend ratio "z" were 12.0 mol %, 28.8 mol %, and 43.1 mol %, respectively. The blended Na ratio [y/(y+z)] was 0.40 ($\leq 0.0143x+0.24$). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 800° C., a single face of the substrate 10 was put in contact with the melt 8 to allow epitaxial growth for 4 hours. Consequently, a single crystal film 12 without any defects and of a film thickness of 80 μm was obtained. The single crystal was compositionally analyzed by X-ray fluorescence analysis. The composition was $Bi_{1.00}Gd_{1.70}Yb_{0.30}Fe_{5.00}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}Fe_{5.000}O_{12}$. It was shown that the magnetic garnet single crystal was a Bi-substituted rare-earth iron garnet single crystal for use in Faraday rotators.

EXAMPLE 2-7

$Gd_2O_3$, $Yb_2O_3$, $Fe_2O_3$, $B_2O_3$, $Bi_2O_3$ and NaOH in total of 2.3 kg were charged in a crucible 4 made of Au. The Fe blend ratio was 15.5 mol %. The B blend ratio "x", the Na blend ratio "y", and the Bi blend ratio "z" were 12.0 mol %, 14.4 mol %, and 57.5 mol %, respectively. The blended Na ratio [y/(y+z)] was 0.20 ($\leq 0.0143x+0.24$). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 820° C., a single face of the substrate 10 was put in contact with the melt 8 to allow epitaxial growth for 4 hours. Consequently, a single crystal film 12 without any defects and of a film thickness of 80 μm was obtained. The single crystal was compositionally analyzed by X-ray fluorescence analysis. The composition was $Bi_{1.00}Gd_{1.70}Yb_{0.30}Fe_{5.00}O_{12}$, with Na detected, while the composition could not absolutely be determined. The composition was examined in detail by the ICP analysis. Consequently, it was shown that that the chemical formula of the magnetic garnet single crystal was $(BiGdYb)_{2.998}Na_{0.002}Fe_{5.000}O_{12}$. It was shown that the magnetic garnet single crystal was a Bi-substituted rare-earth iron garnet single crystal for use in Faraday rotators.

EXAMPLE 2-8

$Gd_2O_3$, $Yb_2O_3$, $Fe_2O_3$, $B_2O_3$, $Bi_2O_3$, NaOH and KOH in total of 2.3 kg were charged in a crucible 4 made of Au. The Fe blend ratio was 15.5 mol %. The B blend ratio "x", the Na blend ratio "y", the Bi blend ratio "z" and the K blend ratio were 12.0 mol %, 2.6 mol %, 50.3 mol % and 18.9 mol %, respectively. The blended Na ratio [y/(y+z)] was 0.05 ($\leq 0.0143x+0.24$). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 800° C., a single face of the substrate 10 was put in contact with the melt 8 to allow epitaxial growth for 4 hours. Consequently, a single crystal film 12 without any defects and of a film thickness of 50 μm was obtained. The single crystal was compositionally analyzed by X-ray fluorescence analysis. The composition was $Bi_{1.00}Gd_{1.70}Yb_{0.30}Fe_{5.00}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}Fe_{5.000}O_{12}$. It was shown that the magnetic garnet single crystal was a Bi-substituted rare-earth iron garnet single crystal for use in Faraday rotators.

COMPARATIVE EXAMPLE 2-1

$Gd_2O_3$, $Yb_2O_3$, $Fe_2O_3$, $B_2O_3$, $Bi_2O_3$, and NaOH in total of 2.3 kg were charged in a crucible 4 made of Au. The Fe blend ratio was 15.5 mol %. The B blend ratio "x", the Na blend ratio "y", and the Bi blend ratio "z" were 13.0 mol %, 28.4 mol %, and 42.5 mol %, respectively. The blended Na ratio [y/(y+z)] was 0.40 ($\leq 0.0143x+0.24$). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 800° C., a single face of the substrate 10 was put in contact with the melt 8 to allow epitaxial growth for 4 hours. Consequently, a single crystal film 12 of a film thickness of 30 μm was obtained. However, numerous crystal defects emerged on the single crystal film, which could never be used in Faraday rotators.

COMPARATIVE EXAMPLE 2-2

$Gd_2O_3$, $Yb_2O_3$, $Fe_2O_3$, $B_2O_3$, $Bi_2O_3$, NaOH and KOH in total of 2.3 kg were charged in a crucible 4 made of Au. The Fe blend ratio was 15.5 mol %. The B blend ratio "x", the Na blend ratio "y", the Bi blend ratio "z" and the K blend ratio were 13.0 mol %, 2.5 mol %, 49.4 mol % and 18.9 mol %, respectively. The blended Na ratio [y/(y+z)] was 0.05 ($\leq 0.0143x+0.24$). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 800° C., a single face of the substrate 10 was put in contact with the melt 8 to allow epitaxial growth for 4 hours. Consequently, a single crystal film 12 of a film thickness of 30 μm was grown. However, numerous crystal defects emerged on the single crystal film, which could never be used in Faraday rotators.

COMPARATIVE EXAMPLE 2-3

$Gd_2O_3$, $Yb_2O_3$, $Fe_2O_3$, $B_2O_3$, $Bi_2O_3$ and NaOH in total of 2.3 kg were charged in a crucible 4 made of Au. The Fe blend ratio was 15.5 mol %. The B blend ratio "x", the Na blend ratio "y", and the Bi blend ratio "z" were 12.0 mol %, 32.4 mol %, and 39.5 mol %, respectively. The blended Na ratio [y/(y+z)] was 0.45 ($>0.0143x+0.24$). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. Just when the temperature of the melt 8 was lowered down to 800° C., solids were deposited in the melt 8 to discontinue the growth of a single crystal film. After the furnace was cooled down to ambient temperature, solids deposited on the surface of the materials in the crucible 4 were analyzed by an X-ray diffraction apparatus. It was shown that the solids were $NaFeO_2$.

COMPARATIVE EXAMPLE 2-4

$Gd_2O_3$, $Yb_2O_3$, $Fe_2O_3$, $B_2O_3$, $Bi_2O_3$ and NaOH in total of 2.3 kg were charged in a crucible 4 made of Au. The Fe blend ratio was 15.5 mol %. The B blend ratio "x", the Na blend ratio "y", and the Bi blend ratio "z" were 7.0 mol %, 30.8 mol %, and 46.2 mol %, respectively. The blended Na ratio [y/(y+z)] was 0.40 (>0.0143x+0.24). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. Just when the temperature of the melt 8 was lowered down to 770° C., solids were deposited in the melt 8 to discontinue the growth of a single crystal film. After the furnace was cooled down to ambient temperature, solids deposited on the surface of the materials in the crucible 4 were analyzed by an X-ray diffraction apparatus. It was shown that the solids were $NaFeO_2$.

COMPARATIVE EXAMPLE 2-5

$Gd_2O_3$, $Yb_2O_3$, $Fe_2O_3$, $B_2O_3$, $Bi_2O_3$ and NaOH in total of 2.3 kg were charged in a crucible 4 made of Au. The Fe blend ratio was 15.5 mol %. The B blend ratio "x", the Na blend ratio "y", and the Bi blend ratio "z" were 2.0 mol %, 24.7 mol %, and 57.5 mol %, respectively. The blended Na ratio [y/(y+z)] was 0.30 (>0.0143x+0.24). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. Just when the temperature of the melt 8 was lowered down to 770° C., solids were deposited in the melt 8 to discontinue the growth of a single crystal film. After the furnace was cooled down to ambient temperature, solids deposited on the surface of the materials in the crucible 4 were analyzed by an X-ray diffraction apparatus. It was shown that the solids were $NaFeO_2$.

COMPARATIVE EXAMPLE 2-6

$Gd_2O_3$, $Yb_2O_3$, $Fe_2O_3$, $B_2O_3$, $Bi_2O_3$ and NaOH in total of 2.3 kg were charged in a crucible 4 made of Au. The Fe blend ratio was 15.5 mol %. The B blend ratio "x", the Na blend ratio "y", and the Bi blend ratio "z" were 1.0 mol %, 21.6 mol %, and 61.6 mol %, respectively. The blended Na ratio [y/(y+z)] was 0.26 (>0.0143x+0.24). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. Just when the temperature of the melt 8 was lowered down to 770° C., solids were deposited in the melt 8 to discontinue the growth of a single crystal film. After the furnace was cooled down to ambient temperature, solids deposited on the surface of the materials in the crucible 4 were analyzed by an X-ray diffraction apparatus. It was shown that the solids were garnet.

COMPARATIVE EXAMPLE 2-7

$Gd_2O_3$, $Yb_2O_3$, $Fe_2O_3$, $B_2O_3$, $Bi_2O_3$, NaOH and KOH in total of 2.3 kg were charged in a crucible 4 made of Au. The Fe blend ratio was 15.5 mol %. The B blend ratio "x", the Na blend ratio "y", the Bi blend ratio "z" and the K blend ratio were 1.0 mol %, 3.0 mol %, 58.5 mol % and 21.6 mol %, respectively. The blended Na ratio [y/(y+z)] was 0.05 (≦0.0143x+0.24). The crucible 4 with the materials charged therein was arranged in an electric furnace. By melting the materials in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. Just when the temperature of the melt 8 was lowered down to 770° C., solids were deposited in the melt 8 to discontinue the growth of a single crystal film. After the furnace was cooled down to ambient temperature, solids deposited on the surface of the materials in the crucible 4 were analyzed by an X-ray diffraction apparatus. It was shown that the solids were garnet.

FIG. 4 is a table collectively showing the growth conditions and others in the Examples and the Comparative Examples as described above. In FIG. 3, the signs ● (E1 through E8) individually represent the B blend ratio "x" and the blended Na ratio [y/(y+z)] in Examples 2-1 through 2-8, while the signs Δ (C1 through C7) individually represent the B blend ratio "x" and the blended Na ratio [y/(y+z)] in Comparative Examples 2-1 through 2-7. As shown in FIGS. 3 and 4, Bi-substituted rare-earth iron garnet single crystals for use in Faraday rotators can be grown in case that the blended Na ratio [y/(y+z)] is larger than zero but not more than 0.41 (0<y/(y+z) ≦0.41). Additionally, Bi-substituted rare-earth iron garnet single crystals for use in Faraday rotators can be grown in case that the blended Na ratio [y/(y+z)] is larger than zero but not more than 0.0143x+0.24 (0<y/(y+z)≦0.0143x+0.24). Bi-substituted rare-earth iron garnet single crystals for use in Faraday rotators can be grown in case that the B blend ratio "x" is 2.0 mol % or more to 12.0 mol % or less (2.0 (mol %)≦x≦12.0 (mol %)). Still additionally, Bi-substituted rare-earth iron garnet single crystals for use in Faraday rotators can be grown in a more stable fashion in case that the blended Na ratio [y/(y+z)] is larger than zero but not more than 0.0143x+0.24 (0<y/(y+z)≦0.0143x+0.24) and that the B blend ratio is 2.0 mol % or more to 12.0 mol % or less (2.0 (mol %)≦x≦12.0 (mol %)).

[Third Mode for Carrying Out the Invention]

The method of producing a magnetic garnet single crystal in a third mode for carrying out the invention is described with reference to FIGS. 5 and 6. In this mode for carrying out the invention, Pb contained in conventional solvents is replaced with sodium (Na) to grow garnet single crystals such as Bi-substituted rare-earth iron garnet single crystals from solvents containing Na, Bi and boron (B). In such manner, Pb contained at a trace amount in conventional such single crystals can be eliminated almost completely. Because only a short time has elapsed after the development of a technique for growing a garnet single crystal from solvents containing Na, Bi and B, the details of the technique have not yet been clearly demonstrated. Particularly, the growing conditions concerning $Fe_2O_3$, $Ga_2O_3$ and $Al_2O_3$ as the main components of the solutes have not yet been shown. Hence, disadvantages may occur, such as no yield of any garnet single crystal or the yield of garnet single crystals with numerous defects or cracks, depending on the growing conditions.

In this mode for carrying out the invention, attempts were made to grow Bi-substituted rare-earth iron garnet single crystals (magnetic garnet single crystals) under various growing conditions such as various blend ratios "x" of iron (Fe), gallium (Ga) and aluminium (Al) as the main components of the solutes. The term "blend ratio" in this specification means the ratio (mol %) of each element in molar number occupying the total molar number of the elements converting to cations (positive ions) in solutions, including for example Na, Bi, B, Fe, Ga, Al and rare earth elements to be charged in a crucible. Further, the term "blend ratio "x" of Fe, Ga and Al" means the sum of the Fe blend ratio, the Ga blend ratio and the Al blend ratio. FIG. 5 is a graph depicting the relation between the blend ratio "x" of Fe, Ga and Al and the solution temperature (growth temperature) "y" for growing garnet single crystal. On the graph, the crosswise axis expresses the blend ratio "x" (mol %) and the longitudinal axis expresses the growth temperature "y" (° C.).

So as to grow a garnet single crystal from a solvent containing Na, Bi and B, a crucible made of gold (Au) is inevitable. Because Au is a soft metal with a relatively low melting point (1064° C.), the Au crucible cannot retain the shape when the solution temperature exceeds 950° C. Therefore, the melting temperature for melting materials charged in the crucible should be 950° C. or less. Because a garnet single crystal is to be grown in a supersaturation state at a temperature lower than the melting temperature, the growth temperature "y" is to be set at 900° C. or less (on the line "a" in FIG. 5 and in the zone below the line). By varying the blend ratio "x" of Fe, Ga and Al, a single crystal was grown. So as to set the growth temperature "y" to 900° C. or less, as shown, the blend ratio "x" of Fe, Ga and Al should be set to 25.5 mol % or less (on the line "b" in FIG. 5 and in the left zone of the line).

When the blend ratio "x" of Fe, Ga and Al is smaller, the growth rate of a garnet single crystal is lower. When the growth rate is significantly slowed down, an exceedingly long time is required for growing a garnet single crystal of a size processable to a Faraday rotator, disadvantageously for producing a garnet single crystal. Specifically when the blend ratio "x" of Fe, Ga and Al is smaller than 9.0 mol %, the growth rate is too much slowed down, so that it is difficult to grow a garnet single crystal suitable for Faraday rotator. Hence, preferably, the blend ratio "x" of Fe, Ga and Al is 9.0 mol % or more (on the line "c" in FIG. 5 and in the zone rightward from the line). So as to set the blend ratio "x" of Fe, Ga and Al to 9.0 mol % or more, it was shown that the growth temperature "y" should be set to 600° C. or more (on the line "d" in FIG. 5 and in the zone above the line).

So as to gain a sufficiently large Faraday rotation angle in a Bi-substituted rare-earth iron garnet ($Bi_zRe_{3-z}Fe_5O_{12}$; Re represents a rare earth element) single crystal, "z" representing the Bi amount is preferably 0.5 or more. When "z" representing the Bi amount is larger than 1.5, in contrast, the supersaturation state gets unstable to induce the emergence of numerous cracks and defects in the garnet single crystal. Accordingly, the Bi amount "z" is preferably 1.5 or less. So as to use the resulting Bi-substituted rare-earth iron garnet single crystal as a Faraday rotator, the Bi amount "z" is preferably 0.5 or more to 1.5 or less.

Because Bi has a larger segregation coefficient at a lower temperature compared with rare earth elements, the Bi amount "z" in the garnet single crystal is likely more when the growth temperature "y" is lower. In case that a material with the same blend ratio "x" of Fe, Ga and Al is used, more likely, the growth temperature "y" for growing a garnet single crystal with a smaller Bi amount "z" is higher, while the growth temperature "y" for growing a garnet single crystal with a larger Bi amount "z" is lower.

By varying the blend ratio "x" of Fe, Ga and Al in a range of 9.0 mol % to 19.0 mol %, Bi-substituted rare-earth iron garnet single crystals with the Bi amount "z" of 0.5 were grown. An almost linear relation as shown by the line "e" in FIG. 5 was observed between the blend ratio "x" and the growth temperature "y". The relation between the blend ratio "x" (mol %) and the growth temperature "y" (° C.) is expressed as $y=555+18.2x$ when the dimensions of the units are neglected. This indicates that the increase of the blend ratio "x" linearly raises the melting points of materials, involving the elevation of the growth temperature "y".

By varying the blend ratio "x" of Fe, Ga and Al in a range of 9.0 mol % to 25.5 mol %, additionally, a Bi-substituted rare-earth iron garnet single crystal at the Bi amount "z" of 1.5 was grown. It was observed that a linear relation as shown by the line "f" with almost the same slope as that of the line "e" existed between the blend ratio "x" and the growth temperature "y", which is lower than the temperature for the line "e" in FIG. 5. The relation between the blend ratio "x" (mol %) and the growth temperature "y" (° C.) can be represented by the equation $y=436+18.2x$, when the dimensions of the units are neglected. Thus, it was indicated that the growth of such single crystal at the blend ratio "x" and the growth temperature "y" on the two lines "e" and "f" and in the zone between these lines could yield Bi-substituted rare-earth iron garnet single crystals suitable for Faraday rotators, where the Bi amount "z" was 0.5 or more to 1.5 or less.

The aforementioned results show the growth conditions preferable for Bi-substituted rare-earth iron garnet single crystals. Specifically, a Bi-substituted rare-earth iron garnet single crystal suitable for Faraday rotator can be grown in case that the blend ratio "x" of Fe, Ga and Al is 9.0 mol % or more to 25.5 mol % or less (on the two lines "c" and "b" and in the zone between the lines in FIG. 5). Additionally, a Bi-substituted rare-earth iron garnet single crystal suitable for Faraday rotator can be grown in case that the growth temperature "y" is 600° C. or more to 900° C. or less (on the two lines "d" and "a" and in the zone between the lines in FIG. 5). Still additionally, a Bi-substituted rare-earth iron garnet single crystal suitable for Faraday rotator can be grown in case that the blend ratio "x" (mol %) of Fe, Ga and Al and the growth temperature "y" (° C.) satisfy the relation of $436+18.2x \leq y \leq 555+18.2x$ (on the two lines "f" and "e" and in the zone between the lines in FIG. 5). By satisfying all the growth conditions like the blend ratio "x" and the growth temperature "y" on the lines "a", "c", "e" and "f" in FIG. 5 and in the zone enclosed with these lines, Bi-substituted rare-earth iron garnet single crystals suitable for Faraday rotator can be grown in a more stable manner.

In this mode for carrying out the invention, Fe, Ga and Al are used as the main components of the solutes to be dissolved in a solvent. However, Ga and Al are not necessarily used. In case that Ga is not used, for example, the blend ratio "x" means the sum of the Fe blend ratio and the Al blend ratio. Additionally in case that neither Ga nor Al is used, the blend ratio "x" means the Fe blend ratio.

In this mode for carrying out the invention, a method of producing a magnetic garnet single crystal at a Pb content preliminarily reduced can be attained. In this mode for carrying out the invention, further, a Bi-substituted rare-earth iron garnet single crystal suitable for Faraday rotator can be grown stably, using a solvent containing Na, Bi and B.

The method of producing a magnetic garnet single crystal in this mode for carrying out the invention is more specifically described in detail in Examples and Comparative Examples.

EXAMPLE 3-1

$Gd_2O_3$, $Yb_2O_3$, $Fe_2O_3$, $Ga_2O_3$, $Al_2O_3$, $B_2O_3$, $Bi_2O_3$ and NaOH in total of 2.3 kg were charged in a crucible "4" made of Au. The blend ratio "x" of Fe, Ga and Al was 14.0 mol %. The B blend ratio, the Bi blend ratio and the Na blend ratio were 8.5 mol %, 52.5 mol % and 24.5 mol %, respectively. The crucible 4 with the materials charged therein was arranged in an electric furnace. By melting the materials at the melting temperature of 900° C. in the crucible 4 by raising the furnace temperature to 900° C., the materials were agitated and a homogenous melt (solution) "8" was generated. A CaMgZr-substituted GGG (gadolinium.gallium.garnet) substrate 10 of a 2-inch diameter was mounted onto a fixing device "2" and then charged into a furnace. After lowering the temperature of the melt 8 to 750° C., a single face of the substrate 10 was put in contact with the melt 8 to allow epitaxial growth at the growth temperature of 750° C. for 4 hours. Provided that y1=436+18.2x and y2=555+18.2x, then, the relation among the growth temperature "y", y1 and y2 was represented by y1<y≤y2. Consequently, a single crystal film 12 without any defects and of a film thickness of 80 μm was obtained. The single crystal was compositionally analyzed by X-ray fluorescence analysis. The composition was $Bi_{1.00}Gd_{1.70}Yb_{0.30}Fe_{4.80}Ga_{0.10}Al_{0.10}O_{12}$, with Na detected, while the composition could not absolutely be determined. The composition was examined in detail by the ICP (inductively coupled plasma) analysis. Consequently, it was shown that the chemical formula of the magnetic garnet single crystal was $(BiGdYb)_{2.998}Na_{0.002}(FeGaAl)_{5.000}O_{12}$. It was shown that the magnetic garnet single crystal was a Bi-substituted rare-earth iron garnet single crystal for use in Faraday rotator.

EXAMPLE 3-2

$Gd_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 14.0 mol %. The B blend ratio, the Bi blend ratio and the Na blend ratio were 8.4 mol %, 52.4 mol % and 24.4 mol %, respectively. The crucible 4 with the materials charged therein was arranged in an electric furnace. By melting the materials at the melting temperature of 900° C. in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 810° C., a single face of the substrate 10 was put in contact with the melt 8 to allow epitaxial growth at the growth temperature of 810° C. for 4 hours. The relation among the growth temperature "y", y1 and y2 was represented by y1<y≈y2. Consequently, a single crystal film 12 without any defects and of a film thickness of 80 μm was obtained. The single crystal was compositionally analyzed by X-ray fluorescence analysis. The composition was $Bi_{0.52}Gd_{2.48}Fe_{4.80}Ga_{0.10}Al_{0.10}O_{12}$, with Na detected, while the composition could not absolutely be determined. The composition was examined in detail by the ICP analysis. Consequently, it was shown that the chemical formula of the magnetic garnet single crystal was $(BiGd)_{2.998}Na_{0.002}(FeGaAl)_{5.000}O_{12}$. It was shown that the magnetic garnet single crystal was a Bi-substituted rare-earth iron garnet single crystal for use in Faraday rotator.

EXAMPLE 3-3

$Gd_2O_3$, $Yb_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 14.0 mol %. The B blend ratio, the Bi blend ratio and the Na blend ratio were 8.5 mol %, 52.6 mol % and 24.5 mol %, respectively. The crucible 4 with the materials charged therein was arranged in an electric furnace. By melting the materials at the melting temperature of 900° C. in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 690° C., a single face of the substrate 10 was put in contact with the melt 8 to allow epitaxial growth at the growth temperature of 690° C. for 4 hours. The relation among the growth temperature "y", y1 and y2 was represented by y1≈y<y2. Consequently, a magnetic garnet single crystal film 12 without any defects and of a film thickness of 80 μm was grown. The single crystal was compositionally analyzed by X-ray fluorescence analysis. The composition was $Bi_{1.50}Gd_{0.87}Yb_{0.63}Fe_{4.80}Ga_{0.10}Al_{0.10}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}(FeGaAl)_{5.000}O_{12}$. It was shown that the magnetic garnet single crystal was a Bi-substituted rare-earth iron garnet single crystal for use in Faraday rotator.

EXAMPLE 3-4

$Gd_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 9.0 mol %. The B blend ratio, the Bi blend ratio and the Na blend ratio were 8.9 mol %, 55.4 mol % and 25.8 mol %, respectively. The crucible 4 with the materials charged therein was arranged in an electric furnace. By melting the materials at the melting temperature of 900° C. in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 720° C., a single face of the substrate 10 was put in contact with the melt 8 to allow epitaxial growth at the growth temperature of 720° C. for 4 hours. The relation among the growth temperature "y", y1 and y2 is y1<y≈y2. Consequently, a single crystal film 12 without any defects and of a film thickness of 80 μm was obtained. The single crystal was compositionally analyzed by X-ray fluorescence analysis. The composition was $Bi_{0.52}Gd_{2.48}Fe_{4.80}Ga_{0.10}Al_{0.10}O_{12}$, with Na detected, while the composition could not absolutely be determined. The composition was examined in detail by the ICP analysis. Consequently, it was shown that the chemical formula of the magnetic garnet single crystal was $(BiGd)_{2.998}Na_{0.002}(FeGaAl)_{5.000}O_{12}$. It was shown that the magnetic garnet single crystal was a Bi-substituted rare-earth iron garnet single crystal for use in Faraday rotator.

EXAMPLE 3-5

$Gd_2O_3$, $Yb_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 9.0 mol %. The B blend ratio, the Bi blend ratio and the Na blend ratio were 8.9 mol %, 55.5 mol % and 25.9 mol %, respectively. The crucible 4 with the materials charged therein was arranged in an electric furnace. By melting the materials at the melting temperature of 900° C. in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 660° C., a single face of the substrate 10 was put in contact with the melt 8 to allow epitaxial growth at the growth temperature of 660° C. for 4 hours. The relation among the growth temperature "y", y1 and y2 is y1<y<y2. Consequently, a single crystal film 12 without any defects and of a film thickness of 80 μm was obtained. The single crystal was compositionally analyzed by X-ray fluorescence analysis. The composition was $Bi_{1.00}Gd_{1.70}Yb_{0.30}Fe_{4.80}Ga_{0.10}Al_{0.10}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}(FeGaAl)_{5.000}O_{12}$. It was shown that the magnetic garnet single crystal was a Bi-substituted rare-earth iron garnet single crystal for use in Faraday rotators.

EXAMPLE 3-6

$Gd_2O_3$, $Yb_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 9.0 mol %. The B blend ratio, the Bi blend ratio and the Na blend ratio were 9.0 mol %, 55.6 mol % and 25.9 mol %, respectively. The crucible 4 with the materials charged therein was arranged in an electric furnace. By melting the materials at the melting temperature of 900° C. in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 600° C., a single face of the substrate 10 was put in contact with the melt 8 to allow epitaxial growth at the growth temperature of 600° C. for 4 hours. The relation among the growth temperature "y", y1 and y2 is y1≈y<y2. Consequently, a single crystal film 12 without any defects and of a film thickness of 80 μm was obtained. The single crystal was compositionally analyzed by X-ray fluorescence analysis. The composition was $Bi_{1.50}Gd_{0.87}Yb_{0.63}Fe_{4.80}Ga_{0.10}Al_{0.10}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}(FeGaAl)_{5.000}O_{12}$. It was shown that the magnetic garnet single crystal was a Bi-substituted rare-earth iron garnet single crystal for use in Faraday rotator.

EXAMPLE 3-7

$Gd_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 19.0 mol %. The B blend ratio, the Bi blend ratio and the Na blend ratio were 8.0 mol %, 49.3 mol % and 23.0 mol %, respectively. The crucible 4 with the materials charged therein was arranged in an electric furnace. By melting the materials at the melting temperature of 950° C. in the crucible 4 by raising the furnace temperature to 950° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 900° C., a single face of the substrate 10 was put in contact with the melt 8 to allow epitaxial growth at the growth temperature of 900° C. for 4 hours. The relation among the growth temperature "y", y1 and y2 is y1<y≈y2. Consequently, a single crystal film 12 without any defects and of a film thickness of 80 μm was obtained. The single crystal was compositionally analyzed by X-ray fluorescence analysis. The composition was $Bi_{0.52}Gd_{2.48}Fe_{4.80}Ga_{0.10}Al_{0.10}O_{12}$, with Na detected, while the composition could not absolutely be determined. The composition was examined in detail by the ICP analysis. Consequently, it was shown that the chemical formula of the magnetic garnet single crystal was $(BiGd)_{2.998}Na_{0.002}(FeGaAl)_{5.000}O_{12}$. It was shown that the magnetic garnet single crystal was a Bi-substituted rare-earth iron garnet single crystal for use in Faraday rotator.

EXAMPLE 3-8

$Gd_2O_3$, $Yb_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio of Fe, Ga and Al was 19.0 mol %. The B blend ratio, the Bi blend ratio and the Na blend ratio were 8.0 mol %, 49.4 mol % and 23.0 mol %, respectively. The crucible 4 with the materials charged therein was arranged in an electric furnace. By melting the materials at the melting temperature of 950° C. in the crucible 4 by raising the furnace temperature to 950° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 840° C., a single face of the substrate 10 was put in contact with the melt 8 to allow epitaxial growth at the growth temperature of 840° C. for 4 hours. The relation among the growth temperature "y", y1 and y2 is y1<y<y2. Consequently, a single crystal film 12 without any defects and of a film thickness of 80 μm was obtained. The single crystal was compositionally analyzed by X-ray fluorescence analysis. The composition was $Bi_{1.00}Gd_{1.70}Yb_{0.30}Fe_{4.80}Ga_{0.10}Al_{0.10}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}(FeGaAl)_{5.000}O_{12}$. It was shown that the magnetic garnet single crystal was a Bi-substituted rare-earth iron garnet single crystal for use in Faraday rotator.

EXAMPLE 3-9

$Gd_2O_3$, $Yb_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 19.0 mol %. The B blend ratio, the Bi blend ratio and the Na blend ratio were 8.0 mol %, 49.5 mol % and 23.1 mol %, respectively. The crucible 4 with the materials charged therein was arranged in an electric furnace. By melting the materials at the melting temperature of 950° C. in the crucible 4 by raising the furnace temperature to 950° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 780° C., a single face of the substrate 10 was put in contact with the melt 8 to allow epitaxial growth at the growth temperature of 780° C. for 4 hours. The relation among the growth temperature "y", y1 and y2 is y1≈y<y2. Consequently, a single crystal film 12 without any defects and of a film thickness of 80 µm was obtained. The single crystal was compositionally analyzed by X-ray fluorescence analysis. The composition was $Bi_{1.50}Gd_{0.87}Yb_{0.63}Fe_{4.80}Ga_{0.10}Al_{0.10}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}(FeGaAl)_{5.000}O_{12}$. It was shown that the magnetic garnet single crystal was a Bi-substituted rare-earth iron garnet single crystal for use in Faraday rotator.

EXAMPLE 3-10

$Gd_2O_3$ $Yb_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 22.0 mol %. The B blend ratio, the Bi blend ratio and the Na blend ratio were 7.7 mol %, 47.6 mol % and 22.2 mol %, respectively. The crucible 4 with the materials charged therein was arranged in an electric furnace. By melting the materials at the melting temperature of 950° C. in the crucible 4 by raising the furnace temperature to 950° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 900° C., a single face of the substrate 10 was put in contact with the melt 8 to allow epitaxial growth at the growth temperature of 900° C. for 4 hours. The relation among the growth temperature "y", y1 and y2 is y1<y<y2. Consequently, a single crystal film 12 without any defects and of a film thickness of 80 µm was obtained. The single crystal was compositionally analyzed by X-ray fluorescence analysis. The composition was $Bi_{1.50}Gd_{0.87}Yb_{0.63}Fe_{4.80}Ga_{0.10}Al_{0.10}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}(FeGaAl)_{5.000}O_{12}$. It was shown that the magnetic garnet single crystal was a Bi-substituted rare-earth iron garnet single crystal for use in Faraday rotator.

EXAMPLE 3-11

$Gd_2O_3$, $Yb_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 25.5 mol %. The B blend ratio, the Bi blend ratio and the Na blend ratio were 7.3 mol %, 45.5 mol % and 21.2 mol %, respectively. The crucible 4 with the materials charged therein was arranged in an electric furnace. By melting the materials at the melting temperature of 950° C. in the crucible 4 by raising the furnace temperature to 950° C., the materials were agitated and a homogenous melt 8 was generated. A CaMgZr-substituted GGG substrate 10, of a 2-inch diameter was mounted onto a fixing device 2 and then charged into a furnace. After lowering the temperature of the melt 8 to 900° C., a single face of the substrate 10 was put in contact with the melt 8 to allow epitaxial growth at the growth temperature of 900° C. for 4 hours. The relation among the growth temperature "y", y1 and y2 is y1≈y<y2. Consequently, a single crystal film 12 without any defects and of a film thickness of 80 µm was obtained. The single crystal was compositionally analyzed by X-ray fluorescence analysis. The composition was $Bi_{1.50}Gd_{0.87}Yb_{0.63}Fe_{4.80}Ga_{0.10}Al_{0.10}O_{12}$, with Na detected, while the composition could not absolutely be determined. The composition was examined in detail by the ICP analysis. Consequently, it was shown that the chemical formula of the magnetic garnet single crystal was $(BiGdYb)_{2.998}Na_{0.002}(FeGaAl)_{5.000}O_{12}$. It was shown that the magnetic garnet single crystal was a Bi-substituted rare-earth iron garnet single crystal for use in Faraday rotator.

COMPARATIVE EXAMPLE 3-1

$Gd_2O_3$, $Yb_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 25.5 mol %. The B blend ratio, the Bi blend ratio and the Na blend ratio were 7.3 mol %, 45.5 mol % and 21.2 mol %, respectively. The crucible 4 with the materials charged therein was arranged in an electric furnace. Trying to melt and agitate the materials in the crucible 4 by raising the furnace temperature to 980° C., the crucible 4 deformed because of the too high furnace temperature, so that no single crystal could be grown.

COMPARATIVE EXAMPLE 3-2

$Gd_2O_3$, $Yb_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 25.5 mol %. The B blend ratio, the Bi blend ratio and the Na blend ratio were 7.3 mol %, 45.5 mol % and 21.2 mol %, respectively. The crucible 4 with the materials charged therein was arranged in an electric furnace. By melting the materials at the melting temperature of 950° C. in the crucible 4 by raising the furnace temperature to 950° C., the materials were agitated and a homogenous melt 8 was generated. A CaMgZr-substituted GGG substrate 10 of a 2-inch diameter was arranged on a fixing device 2 and charged into a furnace. After lowering the temperature of the melt 8 to 880° C., a single face of the substrate 10 was put in contact with the melt 8 to allow epitaxial growth at the growth temperature of 880° C. for 4 hours. The relation among the growth temperature "y", y1 and y2 is y<y1<y2. During the growth, numerous solids were deposited in the melt 8 so that numerous crystal defects emerged on the single crystal film. Hence, the grown single crystal could not be used in Faraday rotator.

COMPARATIVE EXAMPLE 3-3

$Gd_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 19.0 mol %. The B blend ratio, the Bi blend ratio and the Na blend ratio were 8.0 mol %, 49.3 mol % and 23.0 mol %, respectively. The crucible 4 with the materials charged therein was arranged in an electric furnace. Trying to melt and agitate the materials in the crucible 4 by raising the furnace temperature to 980° C., the crucible 4 deformed because of the too high furnace temperature, so that no single crystal could be grown.

COMPARATIVE EXAMPLE 3-4

$Gd_2O_3$, $Yb_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 19.0 mol %. The B blend ratio, the Bi blend ratio and the Na blend ratio were 8.0 mol %, 49.5 mol % and 23.1 mol %, respectively. The crucible 4 with the materials charged therein was arranged in an electric furnace. By melting the materials at the melting temperature of 950° C. in the crucible 4 by raising the furnace temperature to 950° C., the materials were agitated and a homogenous melt 8 was generated. A CaMgZr-substituted GGG substrate 10 of a 2-inch diameter was arranged on a fixing device 2 and charged into a furnace. After lowering the temperature of the melt 8 to 750° C., a single face of the substrate 10 was put in contact with the melt 8 to allow epitaxial growth at the growth temperature of 750° C. for 4 hours. The relation among the growth temperature "y", y1 and y2 is y<y1<y2. During the growth, numerous solids were deposited in the melt 8 so that numerous crystal defects emerged on the single crystal film. Hence, the grown single crystal could not be used in Faraday rotator.

COMPARATIVE EXAMPLE 3-5

$Gd_2O_3$, $Yb_2O_3$, $La_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 9.0 mol %. The B blend ratio, the Bi blend ratio and the Na blend ratio were 8.9 mol %, 55.5 mol % and 25.9 mol %, respectively. The crucible 4 with the materials charged therein was arranged in an electric furnace. By melting the materials at the melting temperature of 900° C. in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 750° C., a single face of the substrate 10 was put in contact with the melt 8 to allow epitaxial growth at the growth temperature of 750° C. for 4 hours. The relation among the growth temperature "y", y1 and y2 is y1<y2<y. Consequently, a single crystal film 12 without any defects and of a film thickness of 80 μm was obtained. The single crystal was compositionally analyzed by X-ray fluorescence analysis. The composition was $Bi_{0.40}Gd_{2.54}La_{0.06}Fe_{4.80}Ga_{0.10}Al_{0.10}O_{12}$, with Na detected, while the composition could not absolutely be determined. The composition was examined in detail by the ICP analysis. Consequently, it was shown that the chemical formula of the magnetic garnet single crystal was $(BiGdLa)_{2.998}Na_{0.002}(FeGaAl)_{5.000}O_{12}$. It was shown that the grown single crystal was at such a smaller Bi content and with such a too small Faraday rotation coefficient that the grown single crystal could not be used in Faraday rotator.

COMPARATIVE EXAMPLE 3-6

$Gd_2O_3$, $Yb_2O_3$, $La_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 9.0 mol %. The B blend ratio, the Bi blend ratio and the Na blend ratio were 8.9 mol %, 55.5 mol % and 25.9 mol %, respectively. The crucible 4 with the materials charged therein was arranged in an electric furnace. By melting the materials at the melting temperature of 900° C. in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 580° C., a single face of the substrate 10 was put in contact with the melt 8 to allow epitaxial growth at the growth temperature of 580° C. for 4 hours. The relation among the growth temperature "y", y1 and y2 is y<y1<y2. During the growth, numerous solids deposited in the melt 8 so that numerous crystal defects emerged on the single crystal film. Hence, the grown single crystal could not be used in Faraday rotators.

COMPARATIVE EXAMPLE 3-7

$Gd_2O_3$, $Yb_2O_3$, $La_2O_3$, $Fe_2O_3$, $Ga_2O_3$, $Al_2O_3$, $B_2O_3$, $Bi_2O_3$ and NaOH in total of 2.3 kg were charged in an Au crucible 4. The blend ratio "x" of Fe, Ga and Al was 8.0 mol %. The B blend ratio, the Bi blend ratio and the Na blend ratio were 9.0 mol %, 56.1 mol % and 26.2 mol %, respectively. The crucible 4 with the materials charged therein was arranged in an electric furnace. By melting the materials at the melting temperature of 900° C. in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 720° C., a single face of the substrate 10 was put in contact with the melt 8 to allow epitaxial growth at the growth temperature of 720° C. for 4 hours. The relation among the growth temperature "y", y1 and y2 is y1<y2<y. Because the growth rate was so slow, however, a single crystal film of a film thickness of 5 μm could only be obtained. Because no film thickness required for Faraday rotator could be obtained at the growth rate even when the growing time period was prolonged. It was shown that the growth conditions in this Comparative Example were unsuitable for growing a magnetic garnet single crystal for use in Faraday rotator.

COMPARATIVE EXAMPLE 3-8

$Gd_2O_3$, $Yb_2O_3$, $La_2O_3$, $Fe_2O_3$, $Ga_2O_3$, $Al_2O_3$, $B_2O_3$, $Bi_2O_3$, and NaOH in total of 2.3 kg were charged in an Au crucible 4. The blend ratio "x" of Fe, Ga and Al was 8.0 mol %. The B blend ratio, the Bi blend ratio and the Na blend ratio were 9.0 mol %, 56.1 mol % and 26.2 mol %, respectively. The crucible 4 with the materials charged therein was arranged in an electric furnace. By melting the materials at the melting temperature of 900° C. in the crucible 4 by raising the furnace temperature to 900° C., the materials were agitated and a homogenous melt 8 was generated. A CaMgZr-substituted GGG substrate 10 of a 2-inch diameter was mounted onto a fixing device 2 and then charged into a furnace. After lowering the temperature of the melt 8 to 600° C., a single face of the substrate 10 was put in contact with the melt 8 to allow epitaxial growth at the growth temperature of 600° C. for 4 hours. The relation among the growth temperature "y", y1 and y2 is y1<y<y2. Because the growth rate was so slow, however, a single crystal film of a film thickness of 10 μm could only be obtained. Because no film thickness required for Faraday rotator could be obtained at the growth rate even when the growing time period was prolonged. It was shown that the growth conditions in this Comparative Example were unsuitable for growing a magnetic garnet single crystal for use in Faraday rotator.

FIG. 6 collectively shows the growth conditions and others in the above Examples and Comparative Examples. In FIG. 5, the signs ● (E1 through E11) express individually the blend ratio "x" and the growth temperature "y" in Examples 3-1 through 3-11, while the signs Δ (C1 through C8) express individually the blend ratio "x" and the growth temperature "y" in Comparative Examples 3-1 through 3-8 (in Comparative Examples 3-1 through 3-3, however, not any single crystals could be grown, so melting temperatures are shown instead of the growth temperature). As shown in FIGS. 5 and 6, Bi-substituted rare-earth iron garnet single crystals for use in Faraday rotators can be grown in case that the blend ratio "x" of Fe, Ga and Al is 9.0 mol % or more to 25.5 mol % or less. In case that the growth temperature "y" is 600° C. or more to 900° C. or less, additionally, Bi-substituted rare-earth iron garnet single crystals for use in Faraday rotator can be grown. Bi-substituted rare-earth iron garnet single crystals for use in Faraday rotator can be grown in case that the blend ratio "x" (mol %) of Fe, Ga and Al and the growth temperature "y" (° C.) satisfy the relation of $436+18.2x \leq y \leq 555+18.2x$. By satisfying all these growth conditions, Bi-substituted rare-earth iron garnet single crystals for use in Faraday rotator can be grown in a more stable manner.

[Fourth Mode for Carrying Out the Invention]

The method of producing a single crystal in a fourth mode for carrying out the invention is described with reference to FIGS. 7 and 8. In this mode for carrying out the invention, Pb contained in conventional solvents is replaced with sodium (Na) to grow single crystals such as Bi-substituted rare-earth iron garnet single crystals from solvents containing Na, Bi and boron (B). In such manner, Pb contained at a trace amount in conventional such single crystals can be eliminated almost completely.

Herein, generally, a crucible made of platinum (Pt) is used for growing garnet single crystals. Pt has a melting point higher than the growth temperature of garnet single crystals and has a relatively high corrosion resistance against the PbO melt for use as a solvent therefor.

However, the growth of garnet single crystals in repetition from solvents containing Na in a Pt crucible sometimes may cause the outward leakage of the melt in the crucible because very small openings may be punctured through the wall of the crucible. When the melt in the crucible leaks out, disadvantageously, the growth of any garnet single crystals may be discontinued, while heaters and others in the furnace for growing the single crystals may incidentally be broken with the melt.

FIG. 7 is an enlarged view of the wall of the Pt crucible used for the repeated growth of garnet single crystals from solvents containing Na, where the melt leaks out. As shown in FIG. 7, the wall surface of the Pt crucible was visually observed. Crystal particles of Pt grew due to the repeated growth of the single crystals. The wall surface of the crucible was further observed with a microscope. It was demonstrated that an opening was punctured in the zone of the Pt crystal particles in the center of FIG. 7, through the inner wall face of the crucible toward the outside. Various oxides such as $Bi_2O_3$ and $B_2O_3$ for use as solvents for growing the single crystal are dispersed onto Pt as the material of the crucible, so that the oxides accumulate in the zone of the crystal particles following the growth of the crystal Pt particles. It is indicated that the opening may be punctured throughout the crucible wall, when the various oxides accumulating in the crystal Pt particle zone are dissolved in solvents containing Na.

Therefore, attempts were made to grow a garnet single crystal using an Au crucible. Specifically, materials containing Na, Bi and B are charged in an Au crucible and melted together. In such manner, a melt containing Na, Bi and B as solvents is generated. Using the melt, Bi-substituted rare-earth iron garnet single crystals are grown by for example the LPE process. By allowing the melt to contain B as a solvent, the garnet single crystal can be grown stably while the solution can be retained at the supersaturation state. In case that an Au crucible was used, garnet single crystals were grown in repetition from Na-containing solvents, without any leakage of the melt in the crucible. The wall surface of the Au crucible was observed visually and with a microscope. FIG. 8 is an enlarged view of the wall face of the Au crucible. As shown in FIG. 8, the growth of Au crystal particles as in the Pt crucible was observed, but without any opening observed.

In case that a garnet single crystal was grown when PbO, $Bi_2O_3$ and $B_2O_3$ are used as solvents, a phenomenon of the accumulation of Pb and others in the crystal Pt particle zone emerged. Nonetheless, no leakage of the melt in the Pt crucible occurred because of the phenomenon. In contrast, the leakage of the melt in the Pt crucible as described above when Na-containing solvents were used may be ascribed to that the Na-containing solvent had a stronger potential to solubilizing materials compared with conventional Pb-containing solvents, so that the Na-containing solvent eroded the crystal Pt particle zone where various oxides accumulated.

Because Au is a metal so hardly oxidizable, meanwhile, various such oxides are hardly dispersed in Au or never accumulate in the crystal particle zone. Thus, the repeated growth of the single crystal from Na-containing solvents involving the progress of the growth of Au particles never causes the erosion of the crystal particle zone. Accordingly, the melt in the Au crucible never leaks out.

The aforementioned effects are advantageously applicable to all processes for growing single crystals from Na-containing solvents, using an Au crucible. When a single crystal other than garnet single crystal is to be grown by the flux processes other than the LPE process from Na-containing solvents, thus, an Au crucible when used can prevent the leakage of the melts.

The method of producing a single crystal in this mode for carrying out the invention is specifically described in detail in Examples and Comparative Examples.

EXAMPLE 4-1

First, a crucible 4 made of Au was prepared, which was a cylindrical shape with an inner diameter of 75 mm and a height of 120 mm. $Gd_2O_3$, $Yb_2O_3$, $Fe_2O_3$, $B_2O_3$, $Bi_2O_3$ and NaOH in total of 2.3 kg were charged in the crucible 4. These materials were charged from the bottom of the crucible 4 to a position at a height of about 75 mm. The crucible 4 with the materials charged therein was arranged in an electric furnace. By melting the materials in the crucible 4 by raising the furnace temperature to 950° C., the materials were agitated and a homogenous melt 8 was generated. A CaMgZr-substituted GGG substrate 10 of a 2-inch diameter was mounted onto a fixing device 2 and then charged into a furnace. After lowering the furnace temperature to 830° C., a single face of the substrate 10 was put in contact with the melt 8 to allow epitaxial growth for 40 hours. Consequently, a magnetic garnet single crystal film (rare-earth iron garnet single crystal film) 12 of a film thickness of 500 μm and with a composition of $(BiGdYb)_3Fe_5O_{12}$ was grown on the substrate 10. The single crystal was grown at atmospheric pressure. The single crystal was cooled down to ambient temperature, then taken out, and passed through a polishing process and the like, to prepare a magnetic garnet single crystal film 12. Thereafter, $Gd_2O_3$, $Yb_2O_3$ and $Fe_2O_3$ were additionally added to the inside of the crucible 4, to repeat the growth of the single crystal 20 times by the same procedures. During the term, nonetheless, no opening was punctured through the crucible 4, thus never causing melt leakage.

COMPARATIVE EXAMPLE 4-1

A crucible 4 made of Pt was prepared, which was a cylindrical shape with an inner diameter of 75 mm and a height of 120 mm. $Gd_2O_3$, $Yb_2O_3$, $Fe_2O_3$, $B_2O_3$, $Bi_2O_3$ and NaOH in total of 2.3 kg were charged in the crucible 4. These materials were charged from the bottom of the crucible 4 to a position at a height of about 75 mm. The crucible 4 with the materials charged therein was arranged in an electric furnace. By melting the materials in the crucible 4 by raising the furnace temperature to 950° C., the materials were agitated and a homogenous melt 8 was generated. A CaMgZr-substituted GGG substrate 10 of a 2-inch diameter was mounted onto a fixing device 2 and then charged into a furnace. After lowering the furnace temperature to 830° C., a single face of the substrate 10 was put in contact with the melt 8 to allow epitaxial growth for 40 hours. Consequently, a magnetic garnet single crystal film 12 of a film thickness of 500 μm and with a composition of $(BiGdYb)_3Fe_5O_{12}$ was grown on the substrate 10. The single crystal was grown at atmospheric pressure. The single crystal was cooled down to ambient temperature, then taken out, and passed through a polishing process and the like, to prepare a magnetic garnet single crystal film 12. Thereafter, $Gd_2O_3$, $Yb_2O_3$ and $Fe_2O_3$ were additionally added to the inside of the crucible 4, to repeat the growth of the single crystal by the same procedures. At the tenth time, an opening happened to be punctured through the crucible 4, causing the occurrence of melt leakage.

As described above, a method of producing the single crystal at a Pb content preliminarily reduced can be attained in this mode for carrying out the invention. According to this mode for carrying out the invention, additionally, the leakage of the melt in the crucible during the repeated growth of the single crystal from Na-containing solvents by the flux process can be prevented.

BRIEF DESCRIPTION OF DRAWINGS

FIG. 4 is a table collectively showing the growth conditions and others in Examples 2-1 through 2-8 and Comparative Examples 2-1 through 2-7;

FIG. 6 is a table collectively showing the growth conditions and others in Examples 3-1 through 3-11 and Comparative Examples 3-1 through 3-8;

Figures 1, 2:
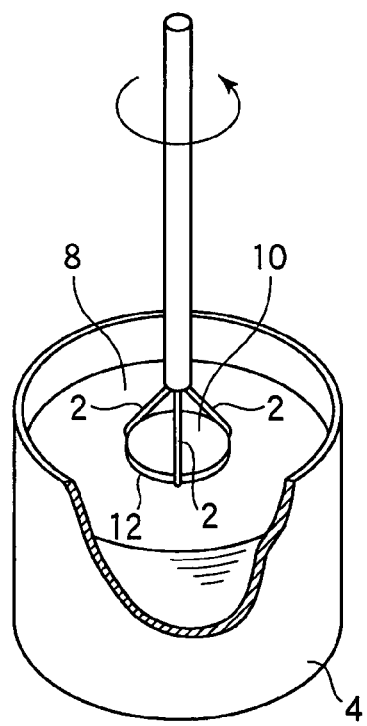
FIG. 1 shows a table depicting the valence number and ion radius of each of the elements potentially entering in the magnetic garnet single crystal in a first mode for carrying out the invention.
FIG. 2 is a view partially depicting the process of producing the magnetic garnet single crystal in the first mode for carrying out the invention.
Figure 3:
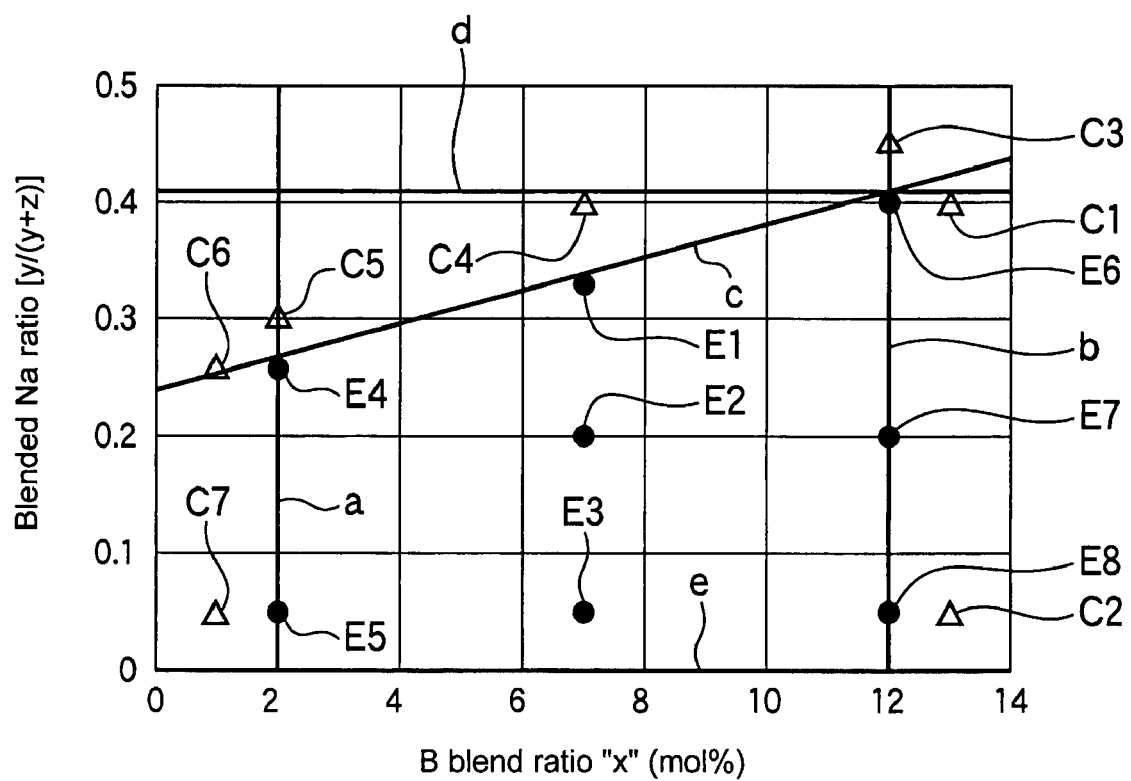
FIG. 3 shows a graph depicting the relation between the B blend ratio "x" and the blended Na ratio [y/(y+z)] according to the method of producing the garnet single crystal in the second mode for carrying out the invention.
Figure 5:
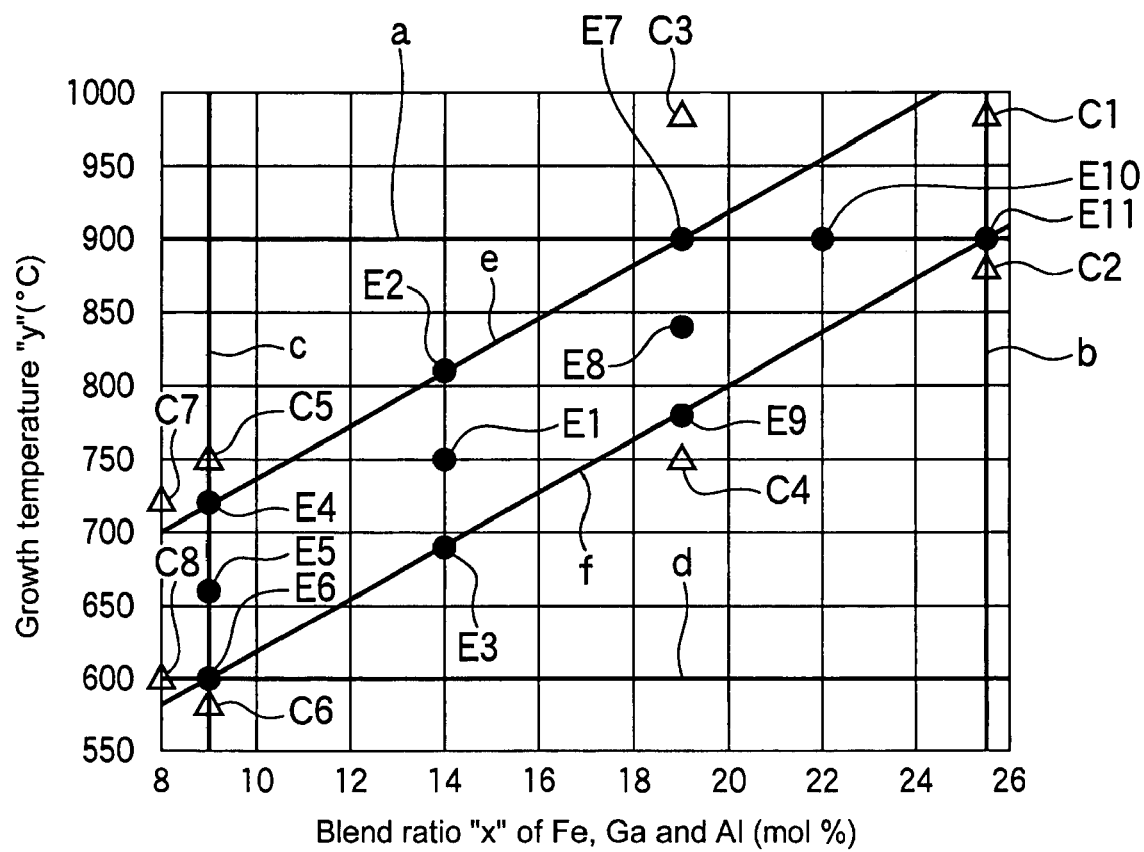
FIG. 5 is a graph depicting the relation between the blend ratio "x" and the growth temperature "y"
Figure 7:
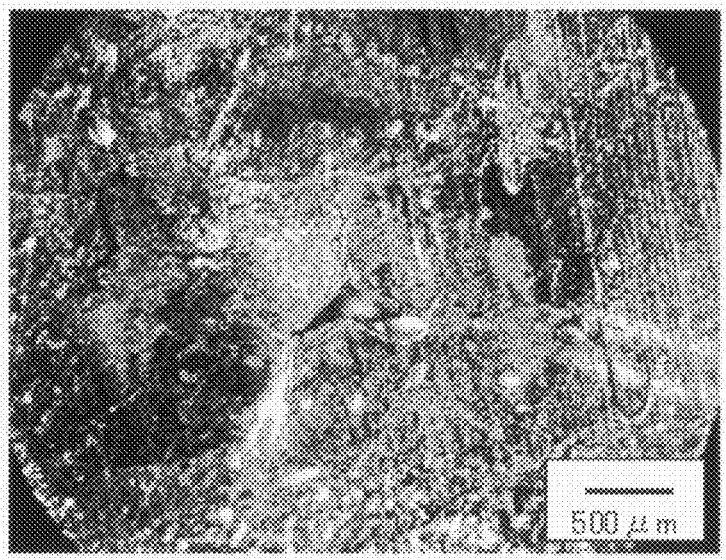
FIG. 7 is an enlarged view of the wall face of a Pt crucible.
Figure 8:
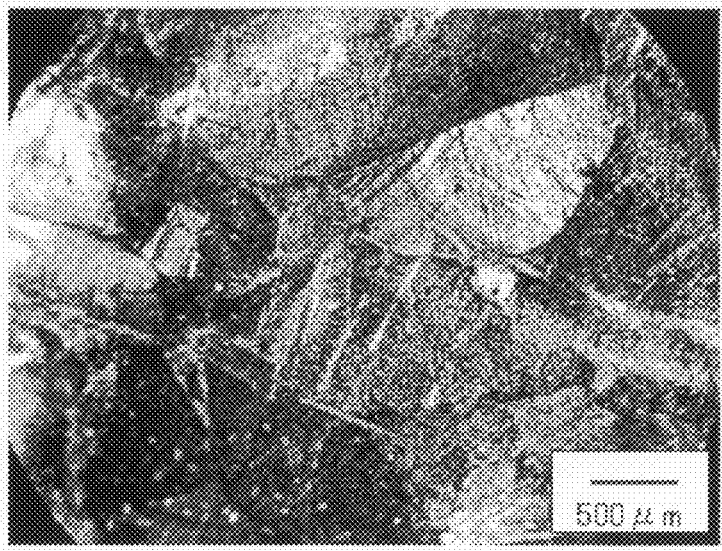
FIG. 8 is an enlarged view of the wall face of an Au crucible.

DESCRIPTION OF THE REFERENCE NUMERALS AND SIGNS 2 fixing device
4 crucible
8 melt
10 substrate
12 single crystal film

The invention claimed is:

1. A magnetic garnet single crystal grown by the liquid phase epitaxial growth process, which is represented by the chemical formula $Bi_xNa_yPb_zM1_{3-x-y-z}Fe_{5-w}M2_wO_{12}$ (M1 is at least one element selected from Y, Sm, Eu, Gd, Tb, Dy, Ho, Er, Tm, Yb and Lu; and M2 is at least one element selected from Ga, Al, In, Ti, Ge, Si and Pt, provided that $0.5 < x \leq 2.0$, $0 < y \leq 0.002$, $0 \leq z < 0.01$, $0.19 \leq 3-x-y-z < 2.5$, and $0 \leq w \leq 1.6$).

2. An optical element prepared by using a magnetic garnet single crystal according to claim 1.

* * * * *